(12) United States Patent
Izumi et al.

(10) Patent No.: US 12,276,702 B2
(45) Date of Patent: *Apr. 15, 2025

(54) BATTERY MANAGEMENT SYSTEM, BATTERY MANAGEMENT METHOD, AND METHOD OF MANUFACTURING BATTERY ASSEMBLY

(71) Applicant: TOYOTA JIDOSHA KABUSHIKI KAISHA, Toyota (JP)

(72) Inventors: Junta Izumi, Nagoya (JP); Akihiro Watanabe, Seto (JP); Toshiki Hori, Seto (JP); Misato Baba, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/498,178

(22) Filed: Oct. 31, 2023

(65) Prior Publication Data

US 2024/0061046 A1 Feb. 22, 2024

Related U.S. Application Data

(63) Continuation of application No. 17/039,090, filed on Sep. 30, 2020, now Pat. No. 11,841,400.

(30) Foreign Application Priority Data

Nov. 5, 2019 (JP) .................................. 2019-200785

(51) Int. Cl.
*G01R 31/371* (2019.01)
*B60L 53/80* (2019.01)
(Continued)

(52) U.S. Cl.
CPC ............ *G01R 31/371* (2019.01); *B60L 53/80* (2019.02); *B60L 58/12* (2019.02); *B60L 58/18* (2019.02);
(Continued)

(58) Field of Classification Search
CPC .............. G01R 31/371; G01R 31/367; G01R 31/3835; G01R 31/382; G01R 31/396;
(Continued)

(56) References Cited

U.S. PATENT DOCUMENTS 9,893,385 B1 2/2018 Nayar et al.
10,803,385 B2 10/2020 Lee et al.
(Continued)

FOREIGN PATENT DOCUMENTS

CN 105676138 A 6/2016
CN 106597288 A 4/2017
(Continued)

OTHER PUBLICATIONS

J. D. Kozlowski, "Electrochemical cell prognostics using online impedance measurements and model-based data fusion techniques," 2003 IEEE Aerospace Conference Proceedings (Cat. No. 03TH8652), Big Sky, MT, USA, 2003, pp. 3257-3270, doi: 10.1109/ AERO. 2003.1234169. (Year: 2003).
(Continued)

*Primary Examiner* — M Baye Diao
(74) *Attorney, Agent, or Firm* — Oliff PLC

(57) ABSTRACT

A battery management system includes a control device and a storage. The storage stores at least one trained neural network. The trained neural network includes an input layer that accepts input data that represents a numeric value for each pixel in an image where a prescribed CCV waveform (a CCV charging waveform or a CCV discharging waveform) of a secondary battery is drawn in a region constituted of a predetermined number of pixels, and when input data is input to the input layer, the trained neural network outputs a full charge capacity of the secondary battery. The control device estimates the full charge capacity of a target battery (Continued)

by inputting input data obtained for the target battery into the input layer of the trained neural network.

10 Claims, 16 Drawing Sheets

(51) Int. Cl.
| | |
|---|---|
| *B60L 58/12* | (2019.01) |
| *B60L 58/18* | (2019.01) |
| *G01R 31/367* | (2019.01) |
| *G01R 31/3835* | (2019.01) |
| *H01M 10/42* | (2006.01) |
| *H01M 10/44* | (2006.01) |

(52) U.S. Cl.
CPC ....... *G01R 31/367* (2019.01); *G01R 31/3835* (2019.01); *H01M 10/4257* (2013.01); *H01M 10/441* (2013.01); *B60L 2240/70* (2013.01); *H01M 2010/4271* (2013.01); *H01M 2010/4278* (2013.01); *H01M 2220/20* (2013.01)

(58) Field of Classification Search
CPC .......... B60L 53/80; B60L 58/12; B60L 58/18; B60L 2240/70; B60L 2260/48; B60L 53/14; B60L 53/66; B60L 53/68; B60L 58/10; B60L 3/12; H01M 10/4257; H01M 10/441; H01M 2010/4271; H01M 2010/4278; H01M 2220/20; H01M 10/48; H01M 10/54; H01M 10/425; H01M 10/44; G06N 3/045; G06N 3/08; G06N 3/04; Y02T 90/12; Y02T 10/70; Y02T 10/7072; Y02T 90/14; Y02T 90/16; Y02T 90/167; Y02E 60/10; Y02W 30/84; Y02W 90/00; Y04S 30/12; G06Q 10/0631; G06Q 10/087; G06Q 10/30; G06Q 30/06

USPC .......................................................... 429/90
See application file for complete search history.

(56) References Cited

U.S. PATENT DOCUMENTS

| | | | |
|---|---|---|---|
| 11,841,400 B2 * | 12/2023 | Izumi | B60L 53/68 |
| 2006/0181245 A1 | 8/2006 | Mizuno et al. | |
| 2017/0259684 A1 * | 9/2017 | Lee | B60L 53/665 |
| 2019/0339332 A1 * | 11/2019 | Tachibana | H01M 10/482 |
| 2020/0164763 A1 * | 5/2020 | Holme | B60L 58/16 |

FOREIGN PATENT DOCUMENTS

| | | | | |
|---|---|---|---|---|
| CN | 109004696 A | | 12/2018 | |
| EP | 3709039 A1 * | | 9/2020 | ............. B60L 58/16 |
| JP | 2003-317810 A | | 11/2003 | |
| JP | 2008-243652 A | | 10/2008 | |
| WO | WO-2018192069 A1 * | | 10/2018 | ......... G01R 31/3648 |

OTHER PUBLICATIONS

J. D. Kozlowski, C. S. Byington, A. K. Garga, M. J. Watson and T. A. Hay, "Model-based predictive diagnostics for electrochemical energy sources," 2001 IEEE Aerospace Conference Proceedings (Cat. No. 01TH8542), Big Sky, MT, USA, 2001, pp. 3149-3164 vol .6, doi: 10.1109/AERO.2001.931332. (Year: 2001).
M. Bezha and N. Nagaoka, "Predicting Voltage Characteristic of Charging Model for Li-Ion Battery with ANN for Real Time Diagnosis," 2018 International Power Electronics Conference (IPEC-Niigata 2018—ECCE Asia), Niigata, Japan, 2018, pp. 3170-3175, doi: 10.23919/IPEC.2018.8507640. (Year: 2018).
Jul. 31, 2023 Notice of Allowance issued in U.S. Appl. No. 17/039,090.
May 5, 2023 Office Action issued in U.S. Appl. No. 17/039,090.

* cited by examiner

《CCV WAVEFORM DURING CONSTANT-CURRENT CHARGING》

《CCV WAVEFORM DURING CONSTANT-CURRENT DISCHARGING》

FIG.11

《NN INFORMATION》

| BATTERY MANUFACTURER | MODEL | TRAINED NN | TRAINING CONDITION | .... |
|---|---|---|---|---|
| X COMPANY | X****01 | NX-1 | *** | .... |
| | X****02 | NX-2 | *** | .... |
| | ⋮ | ⋮ | ⋮ | .... |
| Y COMPANY | Y****01 | NY-1 | *** | .... |
| ⋮ | ⋮ | ⋮ | ⋮ | .... |

FIG.12

《BATTERY INFORMATION》

| M-ID | BATTERY MANUFACTURER | MODEL | MATERIAL | INITIAL CAPACITY | .... |
|---|---|---|---|---|---|
| ID-1 | X COMPANY | X****01 | LIB/NON-AQUEOUS | 25Ah | .... |
| ID-2 | Y COMPANY | Y****01 | LIB/NON-AQUEOUS | 10Ah | .... |
| ID-3 | X COMPANY | X****02 | Ni-MH | 10Ah | .... |
| ID-4 | X COMPANY | X****03 | LIB/ALL-SOLID | 25Ah | .... |
| ⋮ | ⋮ | ⋮ | ⋮ | ⋮ | .... |

BATTERY MANAGEMENT SYSTEM, BATTERY MANAGEMENT METHOD, AND METHOD OF MANUFACTURING BATTERY ASSEMBLY

This application is a Continuation of application Ser. No. 17/039,090, filed Sep. 30, 2020, which claims priority to JP 2019-200785, filed Nov. 5, 2019. The entire contents of the prior applications are hereby incorporated by reference in their entirety.

BACKGROUND

Field

The present disclosure relates to a battery management system, a battery management method, and a method of manufacturing the battery assembly.

Description of the Background Art

An alternating-current (AC) impedance method (which is also referred to as the "AC-IR method" below) has been known as an approach to evaluation of characteristics of a secondary battery. For example, Japanese Patent Laying-Open No. 2003-317810 discloses a method of determining whether or not minor short-circuiting has occurred in a secondary battery based on a reaction resistance value of the secondary battery obtained by the AC-IR method.

SUMMARY

Electrically powered vehicles (for example, electric vehicles or hybrid vehicles) including a secondary battery as a motive power source have increasingly been used in recent years. From a point of view of efficient use of resources, reuse of the secondary battery used in the electrically powered vehicle (which is also referred to as a "used battery" below) has been studied. For example, a system that estimates a full charge capacity of a used battery collected from an electrically powered vehicle, determines reusability based on the estimated full charge capacity, and determines an application (a manner of reuse) may be provided.

In general, a battery assembly to be mounted on a vehicle includes a plurality of (for example, several to more than ten) modules and each of the plurality of modules includes a plurality of (for example, several ten) cells. In general, a secondary battery that makes up a battery assembly is referred to as a "cell." With further prevalence of electric vehicles in the future, the number of used batteries is expected to abruptly increase. Based on such expectation, the inventors of the present application propose a method of estimating a full charge capacity of a large number of used batteries highly accurately and more quickly in a more simplified manner.

Though a method of estimating a full charge capacity of a secondary battery based on a result of measurement with the AC-IR method described previously may be available, such a method suffers from problems pointed out below. In the AC-IR method, dedicated equipment such as a frequency response analyzer and a potentiogalvanostat is used. Such dedicated equipment is expensive. Furthermore, measurement conditions (temperature control, wiring of a measurement cable, and power supply noise) in the AC-IR method are strict and analysis for finding a circuit constant of an equivalent circuit from a result of measurement is complicated. Measurement with the AC-IR method requires expert knowledge and is not easy. Though the AC-IR method can allow relatively quick measurement, rapidity is not yet sufficient and there is a room for improvement also in an aspect of time for measurement.

The present disclosure was made to solve the problems above, and an object thereof is to estimate a full charge capacity of a secondary battery highly accurately and quickly in a simplified manner.

A battery management system according to the present disclosure manages information on a secondary battery. The battery management system includes a storage and an estimation device described below. The storage stores at least one trained neural network. The estimation device estimates, by using the trained neural network, a full charge capacity of a target battery that is a prescribed secondary battery. The trained neural network includes an input layer that accepts input data that represents a numeric value for each pixel in an image where a prescribed CCV waveform of the secondary battery is drawn in a region constituted of a predetermined number of pixels, and when the input data is input to the input layer, the trained neural network outputs the full charge capacity of the secondary battery. The prescribed CCV waveform is any one of a CCV charging waveform that represents transition of a CCV during constant-current charging of the secondary battery and a CCV discharging waveform that represents transition of a CCV during constant-current discharging of the secondary battery. The estimation device estimates the full charge capacity of the target battery by inputting the input data obtained for the target battery into the input layer of the trained neural network.

The "CCV" stands for a closed circuit voltage. The "secondary battery" is a rechargeable battery and includes an aqueous electrolyte solution battery, a non-aqueous electrolyte solution battery, an all-solid-state battery, and a fuel cell. The "secondary battery" may be a cell, a module (which may be denoted as an "MDL" below) including a plurality of cells, or a battery assembly constituted of a plurality of cells electrically connected to one another.

In the battery management system, the trained neural network is used for estimation of a full charge capacity. The inventors of the present application have noted correlation of each of a CCV charging waveform and a CCV discharging waveform obtained during constant-current charging and constant-current discharging with a full charge capacity. Accuracy in estimation by using the trained neural network is mainly determined by quality and quantity of training. By appropriately training an untrained neural network, the trained neural network that can allow highly accurate estimation of the full charge capacity of a secondary battery is obtained. When input data is input to such a trained neural network, the full charge capacity of the secondary battery is output. The number of man-hours for estimation is small and estimation can be made in a simplified manner. Furthermore, a time period required for estimation is short. By using the trained neural network as above, the full charge capacity of the secondary battery can be estimated highly accurately and quickly in a simplified manner without using a special measurement instrument or performing complicated calculation.

The full charge capacity of the secondary battery corresponds to a quantity of electricity stored in the secondary battery when the secondary battery is fully charged. The full charge capacity of the secondary battery lowers as the secondary battery deteriorates. The "full charge capacity" means a full charge capacity of a secondary battery at the current time point unless otherwise specified. Specifically, when the secondary battery has deteriorated at the current time point, the "full charge capacity" means the full charge capacity of the deteriorated secondary battery. The full charge capacity of the secondary battery in an initial state (that is, the secondary battery that has not deteriorated) may be denoted as an "initial capacity" below.

The battery management system may further include a charging apparatus and a first generation device which will be described below. The charging apparatus obtains the prescribed CCV waveform that is the CCV charging waveform for the target battery by carrying out constant-current charging of the target battery. The first generation device generates the input data from the prescribed CCV waveform obtained by the charging apparatus. The estimation device may estimate the full charge capacity of the target battery by inputting the input data generated by the first generation device into the input layer of the trained neural network.

The battery management system can obtain a prescribed CCV waveform (that is, a CCV charging waveform) by carrying out constant-current charging of a target battery, generate input data for the trained neural network, and estimate the full charge capacity of the target battery by using the trained neural network. In order to obtain the prescribed CCV waveform, the charging apparatus may carry out constant-current charging, for example, for a period not shorter than one minute and not longer than thirty minutes at a constant current value selected from a range from 1 A to 5 A.

An SOC range of the prescribed CCV waveform used for generation of the input data by the first generation device may be a prescribed SOC range selected from a range not lower than 0% and not higher than 10%.

A state of charge (SOC) represents a remaining capacity of stored power and is expressed as a ratio of a current amount of stored power to an amount of stored power in a fully charged state, for example, within a range from 0 to 100%. A state in which a battery stores substantially no electricity may be denoted as an "empty state" below. It has been confirmed in experiments conducted by the inventors of the present application that the full charge capacity of the secondary battery can highly accurately be estimated based on a CCV charging waveform during initial charging (more specifically, charging from the empty state to a prescribed SOC equal to or lower than 10%) in generation of input data for a trained neural network. Since the CCV charging waveform during initial charging can be obtained by carrying out constant-current charging of an empty target battery for a short period of time, it is easy to obtain the same. The prescribed SOC range may be a range of the SOC from 0% to 5%.

Any battery management system described above may further include a discharging apparatus and a second generation device which will be described below. The discharging apparatus obtains the prescribed CCV waveform which is the CCV discharging waveform for the target battery by carrying out constant-current discharging of the target battery. The second generation device generates the input data from the prescribed CCV waveform obtained by the discharging apparatus. The estimation device may estimate the full charge capacity of the target battery by inputting the input data generated by the second generation device into the input layer of the trained neural network.

The battery management system can obtain a prescribed CCV waveform (that is, a CCV discharging waveform) by carrying out constant-current discharging of the target battery, generate input data for the trained neural network, and estimate the full charge capacity of the target battery by using the trained neural network.

The at least one trained neural network stored in the storage may include a plurality of trained neural networks. The estimation device may obtain information on the target battery, select one trained neural network corresponding to the target battery from among the plurality of trained neural networks based on the obtained information, and estimate the full charge capacity of the target battery by using the selected trained neural network.

For example, a user can train each neural network in accordance with characteristics of each battery managed by the battery management system and have the storage store a plurality of trained neural networks adapted to the batteries. The estimation device can highly accurately estimate the full charge capacity of the target battery by selecting and using one trained neural network corresponding to the target battery from among the plurality of trained neural networks. The plurality of trained neural networks stored in the storage may be managed as being distinguished based on information on the battery. Examples of the information on the battery include a battery manufacturer, a structure (for example, a dimension, a shape, and a material) of the battery, and an initial capacity of the battery.

Any battery management system described above may further include a sorting device that determines an application of the target battery based on the full charge capacity estimated by the estimation device.

The battery management system can determine an application of each battery based on the full charge capacity of each battery. Each battery can thus be managed for each application. The battery management system is suitable, for example, for reuse of the battery.

A battery management method according to the present disclosure includes first to fourth steps which will be described below. In the first step, a prescribed CCV waveform of a target battery that is a prescribed secondary battery is obtained. In the second step, input data for a trained neural network is generated from the prescribed CCV waveform obtained in the first step. In the third step, the input data generated in the second step is input to the trained neural network. In the fourth step, the trained neural network estimates (outputs) a full charge capacity of the target battery. The input data is data that represents a numeric value for each pixel in an image where the prescribed CCV waveform of the target battery is drawn in a region constituted of a predetermined number of pixels. The prescribed CCV waveform is any one of a CCV charging waveform that represents transition of a CCV during constant-current charging of the target battery and a CCV discharging waveform that represents transition of a CCV during constant-current discharging of the target battery.

According to the battery management method as well, similarly to the battery management system described previously, by using the trained neural network, the full charge capacity of the secondary battery can be estimated highly accurately and quickly in a simplified manner without using a special measurement instrument or performing complicated calculation.

An analysis apparatus may perform the first to fourth steps in accordance with an instruction from a user. The first to fourth steps may fully be automated. For example, a computer may automatically perform the first to fourth steps based on a signal from a sensor. The first to fourth steps may be performed by a plurality of computers or a single computer.

The battery management method may include, before the first step, performing a preparation process for each vehicle to store a plurality of secondary batteries in an empty state.

The preparation process may include steps of collecting the secondary battery from a vehicle, carrying out remaining capacity discharging of the collected secondary battery, and storing the secondary battery in an empty state after the remaining capacity discharging. In the first step, the target battery may be selected from among the plurality of secondary batteries stored in the empty state, and by carrying out constant-current charging of the target battery, the prescribed CCV waveform which is the CCV charging waveform may be obtained for the target battery.

"Remaining capacity discharging" means that the battery is discharged until it is empty (that is, a state in which the battery stores substantially no electricity). The secondary battery tends to deteriorate when it is left stand in a high SOC state. According to the battery management method, deterioration of a battery during storage can be suppressed by storing a plurality of secondary batteries collected from each of a plurality of vehicles in the empty state. By carrying out constant-current charging of a target battery from the empty state, the CCV charging waveform during initial charging described previously can readily be obtained. According to the battery management method, the full charge capacity of each secondary battery collected from each vehicle can be estimated highly accurately and quickly in a simplified manner.

The vehicle may be an electrically powered vehicle. The electrically powered vehicle refers to a vehicle that travels with electric power stored in a secondary battery. Examples of the electrically powered vehicle include an electric vehicle (EV), a hybrid vehicle (HV), and a plug-in hybrid vehicle (PHV) as well as a fuel cell vehicle (FC vehicle) and a range extender EV.

Any battery management method described above may further include, after the fourth step, sorting the target battery based on the full charge capacity estimated in the fourth step and shipping the target battery in accordance with a result of sorting.

"Shipment" means taking out batteries from a storage location. According to the battery management method, the full charge capacity of the target battery can be estimated highly accurately and quickly in a simplified manner before shipment of the target battery. Thereafter, by sorting target batteries based on the estimated full charge capacity and shipping the target batteries in accordance with a result of sorting, a process from estimation of the full charge capacity until shipment smoothly proceeds. When constant-current charging of the target battery is carried out in the first step, by continuing this charging, the target battery may fully be charged by the time of shipment.

A method of manufacturing a battery assembly according to the present disclosure includes first to fifth steps which will be described below. In the first step, a prescribed CCV waveform of a target battery that is a prescribed secondary battery is obtained. In the second step, input data for a trained neural network is generated from the prescribed CCV waveform obtained in the first step. In the third step, the input data generated in the second step is input to the trained neural network. In the fourth step, the trained neural network estimates (outputs) a full charge capacity of the target battery. In the fifth step, a battery assembly is manufactured from a plurality of secondary batteries of which full charge capacity has been estimated by the trained neural network. The input data is data that represents a numeric value for each pixel in an image where the prescribed CCV waveform of the target battery is drawn in a region constituted of a predetermined number of pixels. The prescribed CCV waveform is any one of a CCV charging waveform that represents transition of a CCV during constant-current charging of the target battery and a CCV discharging waveform that represents transition of a CCV during constant-current discharging of the target battery.

According to the method of manufacturing a battery assembly, a full charge capacity of the secondary battery can be estimated highly accurately and quickly in a simplified manner by using the trained neural network and a battery assembly can be manufactured from a plurality of secondary batteries with an appropriate full charge capacity based on a result of estimation.

The first to fourth steps are the same as the first to fourth steps in the battery management method described previously. The fifth step may be performed by a user himself/herself or by a manufacturing apparatus in accordance with an instruction from the user. The first to fifth steps may fully be automated.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 11 is a diagram showing exemplary NN information held by a battery management apparatus shown in FIG. 4.

FIG. 12 is a diagram showing exemplary battery information held by the battery management apparatus shown in FIG. 4.

DESCRIPTION OF THE PREFERRED EMBODIMENTS

Figure 1:
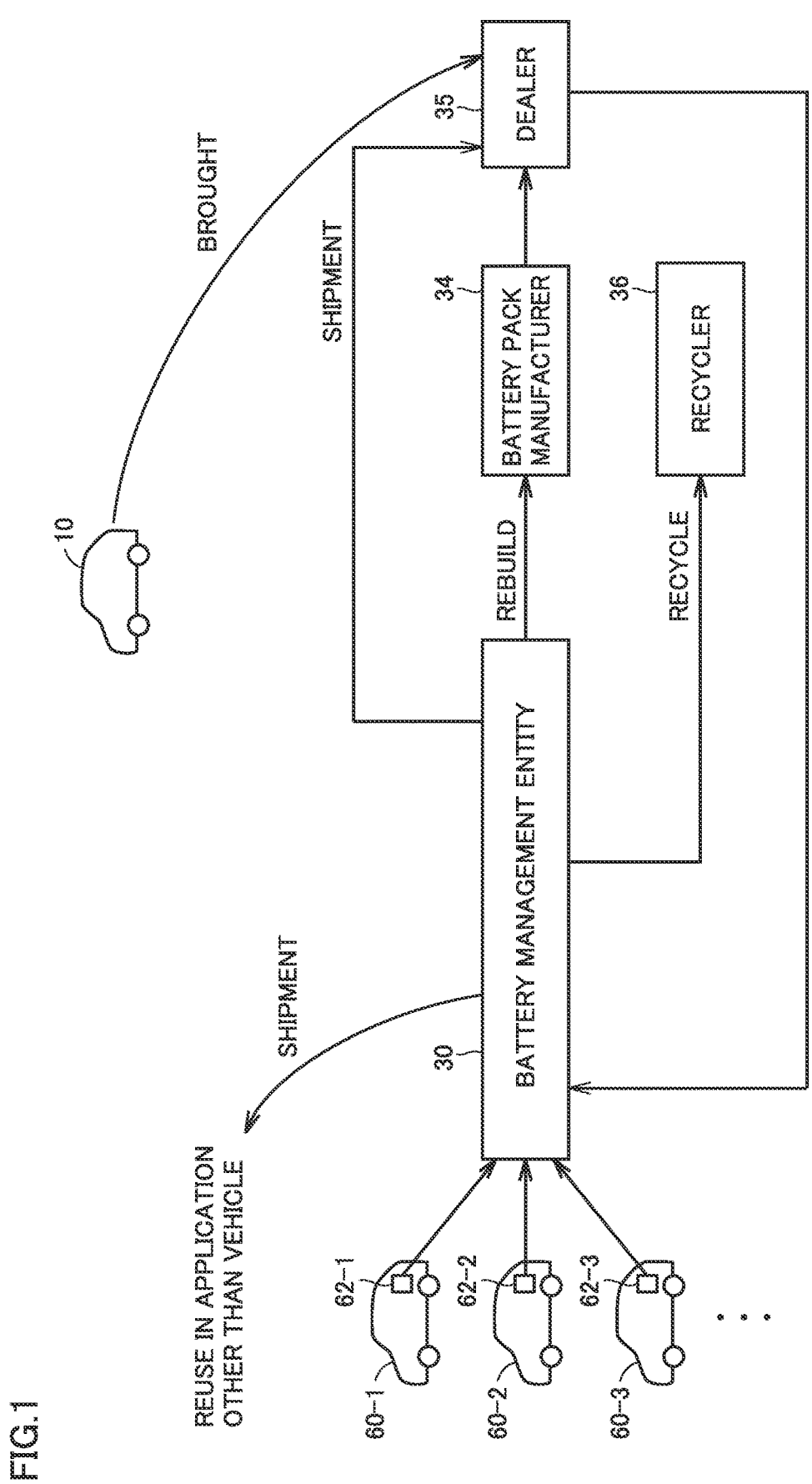
FIG. 1 is a diagram showing one manner of distribution from collection to manufacturing and sales of battery packs in an embodiment of the present disclosure.

An embodiment of the present disclosure will be described in detail with reference to the drawings. The same or corresponding elements in the drawings have the same reference characters allotted and description thereof will not be repeated.

In the embodiment which will be described below, a used battery assembly collected from a vehicle is reused. The battery assembly includes a plurality of modules. The plurality of modules that make up the battery assembly may be connected in series or in parallel. Each of the plurality of modules includes a plurality of cells that are electrically connected (for example, in series). Though any secondary battery can be adopted as a cell that makes up the battery assembly, a lithium ion battery and a nickel metal hydride battery will mainly be described below as representative examples of a vehicle-mounted battery.

"Reuse" of a battery assembly is broadly categorized into reuse of all cells (which is also referred to as "full reuse" below), reuse of some cells (which is also referred to as "partial reuse" below), and resource recycle. Partial reuse is further categorized into use of parts and rebuild.

In full reuse, a battery assembly collected from a vehicle is reused after appropriate reconditioning processing and a prescribed performance test, without replacement of a cell.

In partial reuse, a battery assembly collected from a vehicle is disassembled into prescribed reuse units (for example, modules or cells). A plurality of reuse units are thus obtained.

In use of parts, a plurality of reuse units obtained by disassembly of the battery assembly are subjected to prescribed shipment inspection and the reuse units that have passed the shipment inspection are shipped.

In rebuild, a battery assembly is manufactured from appropriate reuse units of the plurality of reuse units obtained by disassembly of the battery assembly. For example, a new battery assembly is manufactured by combining a plurality of appropriate reuse units. Alternatively, a part of the battery assembly is replaced with appropriate reuse units to reconstruct the battery assembly. A battery assembly thus manufactured (that is, a rebuilt product) is shipped after it passes the shipment inspection.

In resource recycle, a battery assembly collected from a vehicle is disassembled into battery materials and a reclaimable material is taken out of the battery assembly.

FIG. 1 is a diagram showing one manner of distribution from collection to manufacturing and sales of battery packs in the embodiment of the present disclosure. A manner of distribution shown in FIG. 1 is referred to as a "battery distribution model" below.

Referring to FIG. 1, the battery distribution model is constructed of a battery management entity 30 (which is also simply referred to as a "management entity 30" below), a battery pack manufacturer 34 (which is also simply referred to as a "manufacturer 34" below), a dealer 35, a recycler 36, and a battery management system which will be described below.

Figure 2:
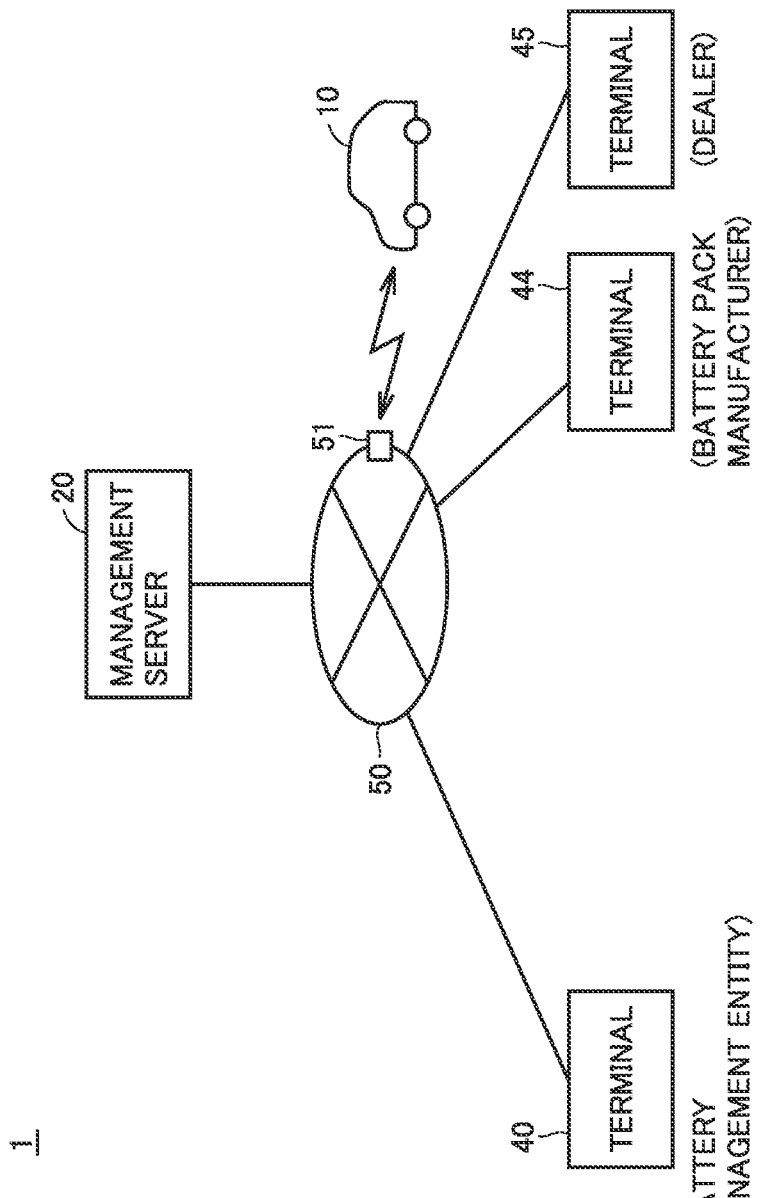
FIG. 2 is a diagram showing an exemplary communication network constructed in a battery management system according to the embodiment of the present disclosure.

FIG. 2 is a diagram showing an exemplary communication network constructed in the battery management system according to this embodiment. Referring to FIG. 2, a battery management system 1 includes a vehicle 10, a management server 20, terminals 40, 44, and 45, and a communication network 50. Vehicle 10, management server 20, and terminals 40, 44, and 45 can communicate with one another over communication network 50. Communication network 50 may be a network constructed of the Internet and a base station. Communication network 50 includes a base station 51. Vehicle 10 can transmit and receive information through wireless communication to and from base station 51 over communication network 50. Though FIG. 2 shows only a single vehicle 10, battery management system 1 includes a plurality of vehicles (for example, vehicles 60-1, 60-2, 60-3, . . . shown in FIG. 1). Management server 20 can communicate with all vehicles registered in advance. Terminals 40, 44, and 45 are terminals of management entity 30, manufacturer 34, and dealer 35 shown in FIG. 1, respectively.

Management entity 30 shown in FIG. 1 collects used battery packs from vehicles 60-1, 60-2, 60-3, . . . shown in FIG. 1. Vehicles 60-1, 60-2, 60-3, . . . incorporate battery packs 62-1, 62-2, 62-3, . . . , respectively, and each battery pack includes a battery assembly constituted of a plurality of modules. Management entity 30 may receive from dealer 35, used battery packs collected from vehicle 10.

Figure 3:
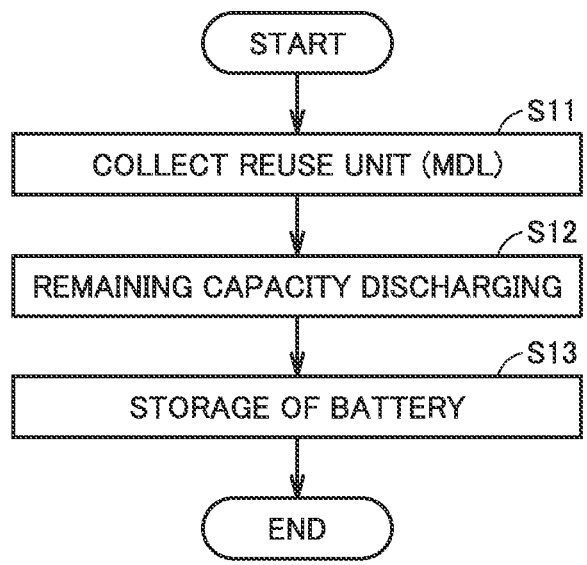
FIG. 3 is a flowchart showing an exemplary work performed after a management entity collects battery packs from a vehicle.

FIG. 3 is a flowchart showing an exemplary work performed after management entity 30 collects a battery pack from a vehicle.

Referring to FIG. 3 together with FIGS. 1 and 2, in step (which is also simply denoted as "S" below) 11, management entity 30 takes out a battery assembly from a battery pack collected from a vehicle, disassembles the battery assembly, and collects reuse units. The reuse unit may be a cell or a module which is a set of cells. In this embodiment, a module (MDL) is defined as the reuse unit.

In S12, management entity 30 carries out remaining capacity discharging of each of a plurality of reuse units (that is, a plurality of modules) obtained by disassembly of a battery assembly. Each cell in the reuse unit thus becomes empty (that is, stores substantially no electricity).

In S13, management entity 30 stores the plurality of reuse units (that is, the plurality of modules) for which remaining capacity discharging was carried out, at a prescribed storage location (for example, a storage space 500 shown in FIG. 4 which will be described later). Management entity 30 provides for each module to be stored, an ID (which is also referred to as an "M-ID" below) for identifying the module. In terminal 40, information on each module stored by management entity 30 is managed as being associated with the M-ID. Management entity 30 transmits the M-ID and module information to management server 20 by using terminal 40. Though FIG. 1 shows only management entity 30, there is a battery management entity for each location. Module information managed by the battery management entity at each location is collected from the battery management entity at each location to management server 20. Management server 20 collectively manages module information managed by the battery management entity at each location, as being distinguished for each location (that is, for each battery management entity).

S11 to S13 are performed for each vehicle. The plurality of modules are thus stored in an empty state (that is, a state in which substantially no electricity is stored). By storing the plurality of modules collected from each of the plurality of vehicles in the empty state, deterioration of modules during storage can be suppressed. Management entity 30 may perform reconditioning processing on the reuse units before S12. Reconditioning processing is processing for reconditioning a restorable battery (for example, recovery from high-rate deterioration or failure of an accessory). Reconditioning processing may be charging or discharging for recovery from high-rate deterioration or may be replacement of an accessory.

Referring again to FIGS. 1 and 2, management entity 30 conducts a performance test on the stored reuse units (in this embodiment, the modules) and sorts the reuse units in accordance with a result of the test. In this embodiment, the full charge capacity is estimated in the performance test. By sorting the reuse units, an application of the reuse units is determined. An application may be determined in any manner, and for example, the reuse units may be sorted into reuse units for use of parts/rebuild/resource recycle or into batteries for vehicles/stationary batteries. The batteries for vehicles may further be sorted into batteries for large vehicles/batteries for compact vehicles, and the stationary batteries may further be sorted into batteries for households/batteries for buildings/batteries for stores/batteries for factories. The stationary battery may be used for regulation of supply and demand of renewable energy (for example, solar energy).

The reuse unit (in this embodiment, the module) sorted into "resource recycle" by management entity 30 is passed from management entity 30 to recycler 36. Recycler 36 disassembles the reuse units received from management entity 30 into battery materials to thereby reclaim the materials for use as new cells or as source materials for other products.

The reuse unit (in this embodiment, the module) sorted into "rebuild" by management entity 30 is passed from management entity 30 to manufacturer 34. Manufacturer 34 manufactures battery assemblies from the reuse units received from management entity 30 and mounts the manufactured battery assembly on a battery pack. Manufacturer 34 brings the battery pack to completion by attaching an accessory (for example, a constrained plate, a sensor, and a relay) to the battery assembly.

The battery pack including the battery assembly manufactured by manufacturer 34 is passed from manufacturer 34 to dealer 35. Dealer 35 sells the battery pack, sells a new vehicle incorporating the battery pack, or accepts an order for rebuild (reconstruction) of the battery assembly used in a vehicle.

Dealer 35 provides for each vehicle, an ID (which is also referred to as a "vehicle ID" below) for identifying the vehicle, and manages information on each vehicle as being associated with the vehicle ID in terminal 45. Information on the vehicle includes a communication address of communication equipment mounted on each vehicle. Dealer 35 transmits the vehicle ID and information on each vehicle to management server 20 by using terminal 45. Though FIG. 1 shows only dealer 35, there is a dealer at each location. Information on the vehicle managed by the dealer at each location is collected from the dealer at each location and each vehicle to management server 20. Management server 20 collectively manages information on the vehicle managed by the dealer at each location, as being distinguished for each location (that is, for each dealer).

In the battery distribution model shown in FIG. 1, when a user of vehicle 10 who has felt a poor condition of the battery pack brings vehicle 10 to dealer 35 and asks the dealer to repair the battery pack, for example, the battery pack is repaired in the following procedure.

The user of vehicle 10 passes vehicle 10 over dealer 35. Dealer 35 provides a vehicle ID to vehicle 10. When the vehicle ID has already been provided to vehicle 10, the vehicle ID is not provided. Dealer 35 determines whether or not the battery assembly mounted on vehicle 10 is fully reusable.

When vehicle 10 is determined as being fully reusable, dealer 35 restores the battery assembly by performing reconditioning processing without replacing cells. The battery assembly that has undergone reconditioning processing is mounted on vehicle 10 after the performance test.

When vehicle 10 is determined as not being fully reusable, dealer 35 places an order with manufacturer 34 to rebuild the battery assembly. At this time, dealer 35 sends the battery pack collected from vehicle 10 to manufacturer 34 together with the vehicle ID. Manufacturer 34 requests management entity 30 to provide reuse units (in this embodiment, modules) necessary for rebuild, and receives the reuse units from management entity 30. Then, manufacturer 34 rebuilds the battery assembly from the received reuse units. The battery pack including the manufactured battery assembly (that is, a rebuilt product) is delivered to dealer 35 to which vehicle 10 has been brought, and mounted on vehicle 10 at dealer 35 after the performance test.

Though management entity 30, manufacturer 34, and dealer 35 are individual entities in FIG. 1, classification of entities is not limited as such. For example, a single entity may serve as management entity 30, manufacturer 34, and dealer 35.

The battery management system according to this embodiment is provided at a location of management entity 30. The battery management system manages information on a secondary battery. Though details will be described later, the battery management system according to this embodiment estimates the full charge capacity of the secondary battery by using a trained neural network. FIG. 4 is a diagram showing overview of the battery management system according to this embodiment.

Figure 4:
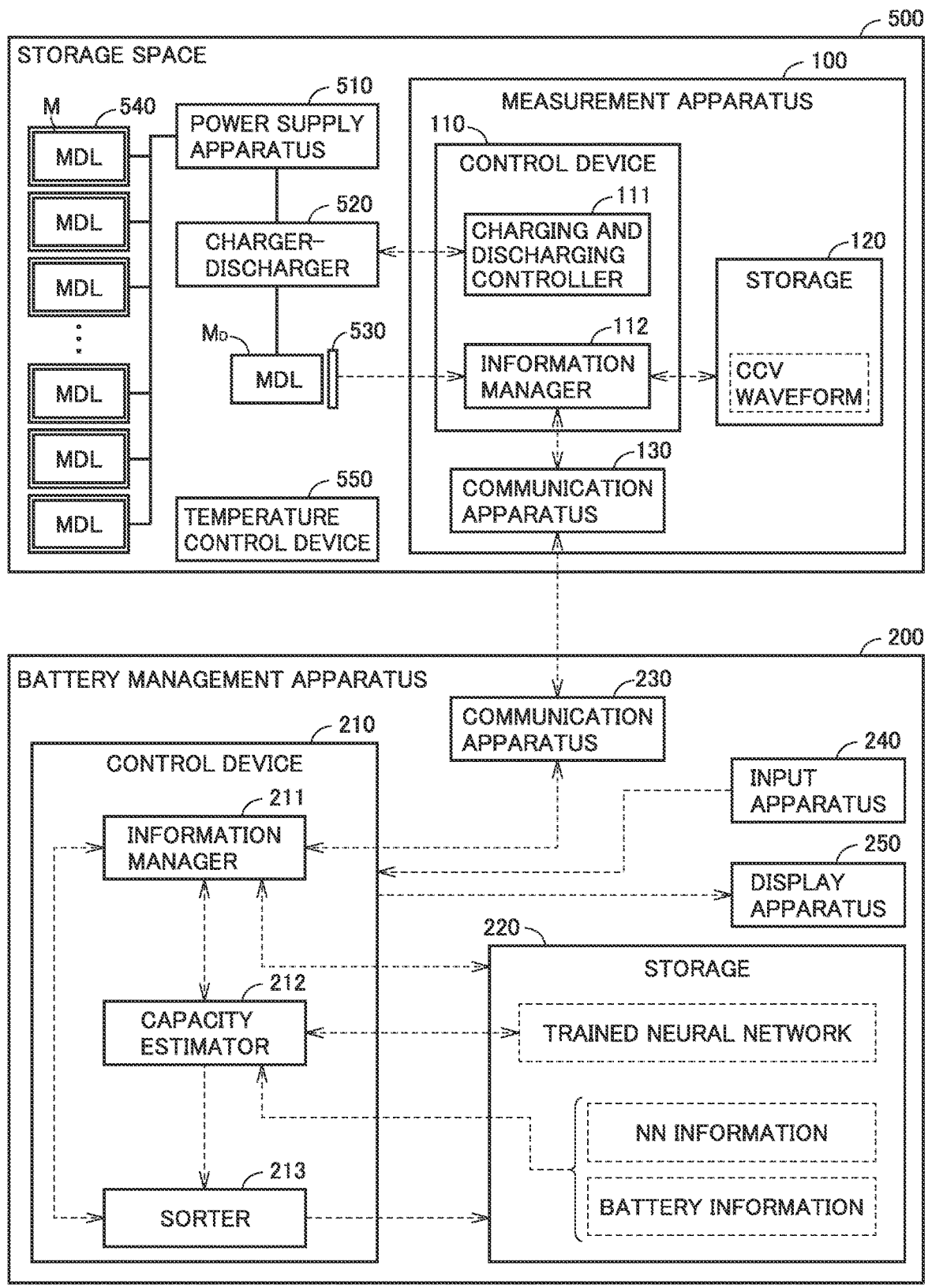
FIG. 4 is a diagram showing overview of the battery management system according to the embodiment of the present disclosure.

Referring to FIG. 4 together with FIGS. 1 and 2, the battery management system according to this embodiment includes an analysis apparatus that obtains information on a secondary battery and storage space 500 where secondary batteries are stored. The analysis apparatus includes a measurement apparatus 100, a battery management apparatus 200, a power supply apparatus 510, a charger-discharger 520, and a sensor module 530. In this embodiment, measurement apparatus 100, power supply apparatus 510, charger-discharger 520, and sensor module 530 are provided in storage space 500, and battery management apparatus 200 is provided outside storage space 500. Battery management apparatus 200 is mounted, for example, on terminal 40 shown in FIG. 2. A plurality of automatic discharging apparatuses 540 and a temperature control device 550 are provided in storage space 500.

Power supply apparatus 510 is electrically connected to each of charger-discharger 520 and the plurality of automatic discharging apparatuses 540. Power supply apparatus 510 includes a power storage. Management entity 30 sets a module M collected from a vehicle onto automatic discharging apparatus 540 in S12 in FIG. 3. This work may be done by a user himself/herself or by a robot in accordance with an instruction from battery management apparatus 200 or a prescribed program. When module M is set, automatic discharging apparatus 540 automatically carries out remaining capacity discharging of module M (that is, discharging until module M is empty). Electric power discharged from each module M set in each automatic discharging apparatus 540 is output to power supply apparatus 510 and stored in the power storage. According to such a configuration, S12 (remaining capacity discharging) and S13 (storage of the battery) in FIG. 3 can simultaneously be performed (and a time period for the process can be reduced). Temperature control device 550 adjusts a temperature in storage space 500 to a set value while it measures a temperature in storage space 500. Temperature control device 550 may air-condition storage space 500. The temperature in storage space 500 is maintained at a prescribed temperature (for example, approximately 25° C.) by temperature control device 550.

Power supply apparatus 510 supplies electric power to charger-discharger 520. Power supply apparatus 510 is connected to a power grid (that is, a power grid provided by an electric utility), performs prescribed power conversion on electric power supplied from the power grid, and supplies resultant electric power to charger-discharger 520.

Management entity 30 conducts a performance test of a secondary battery with the analysis apparatus before shipment of the secondary battery. Management entity 30 connects a module M D (a target battery) to be shipped among a plurality of modules M stored in the empty state to charger-discharger 520. This work may be done by a user himself/herself or by a robot in accordance with an instruction from battery management apparatus 200 or a prescribed program. Charger-discharger 520 carries out constant-current charging onto module $M_D$ with electric power supplied from power supply apparatus 510. More specifically, charger-discharger 520 charges module $M_D$ at a constant current value by converting electric power supplied from power supply apparatus 510 into electric power suitable for constant-current charging and supplying resultant electric power to module $M_D$.

Charger-discharger 520 includes a relay that switches between connection and disconnection of a power path from power supply apparatus 510 to module $M_D$ and a power conversion circuit (neither of which is shown). The power conversion circuit may include at least one of a rectification circuit, a power factor correction (PFC) circuit, an insulating circuit (for example, an insulating transformer), a DC/DC converter, an inverter, and a filter circuit. Each of the relay and the power conversion circuit included in charger-discharger 520 is controlled by a control device 110 of measurement apparatus 100. Charger-discharger 520 charges module $M_D$ in accordance with an instruction from control device 110. Charger-discharger 520 discharges module $M_D$ in accordance with an instruction from control device 110 and outputs electric power output from module $M_D$ to power supply apparatus 510.

Sensor module 530 includes various sensors that detect a state (for example, a voltage, a current, and a temperature) of module $M_D$ connected to charger-discharger 520 and outputs a result of detection to measurement apparatus 100. An output from sensor module 530 is input to control device 110 of measurement apparatus 100. Control device 110 can obtain the state (for example, a temperature, a current, a voltage, an SOC, and an internal resistance) of module $M_D$ based on the output from sensor module 530.

Measurement apparatus 100 includes control device 110, a storage 120, and a communication apparatus 130. Battery management apparatus 200 includes a control device 210, a storage 220, a communication apparatus 230, an input apparatus 240, and a display apparatus 250. A microcomputer including a processor and a random access memory (RAM) can be adopted as each of control devices 110 and 210. A central processing unit (CPU) can be adopted as the processor. Each of storages 120 and 220 includes, for example, a read only memory (ROM) and a rewritable non-volatile memory. Each of storages 120 and 220 stores not only a program but also information (for example, a map, a mathematical expression, and various parameters) to be used by a program. Any number of processors may be provided in measurement apparatus 100 and battery management apparatus 200 and a processor may be prepared for each prescribed type of control.

Each of communication apparatuses 130 and 230 includes a prescribed communication interface (I/F). Measurement apparatus 100 and battery management apparatus 200 can communicate with each other through communication apparatuses 130 and 230. Communication may be wired or wireless.

Input apparatus 240 accepts an input from a user. Input apparatus 240 is operated by a user and outputs a signal corresponding to the operation by the user to control device 210. For example, the user can input a prescribed instruction or request to control device 210 or set a parameter value in control device 210 through input apparatus 240. Communication may be wired or wireless. Various pointing devices (a mouse and a touch pad), a keyboard, or a touch panel can be adopted as input apparatus 240. Input apparatus 240 may be an operation portion of a portable device (for example, a notebook personal computer, a smartphone, or a wearable device).

Display apparatus 250 shows information input from control device 210. Control device 210 can give information to a user through display apparatus 250. Examples of display apparatus 250 include a cathode ray tube (CRT) display, a liquid crystal display (LCD), and a touch panel display. Display apparatus 250 may be a display of a portable device. Display apparatus 250 may perform a speaker function.

Control device 110 includes a charging and discharging controller 111 and an information manager 112. Each of these components is implemented, for example, by a processor and a program executed by the processor. Without being limited as such, each of these components may be implemented by dedicated hardware (electronic circuitry).

Charging and discharging controller 111 controls charger-discharger 520 to control charging and discharging of module $M_D$ connected to charger-discharger 520. In this embodiment, charging and discharging controller 111 controls charger-discharger 520 to carry out constant-current charging of module $M_D$ and to obtain a CCV charging waveform of module $M_D$ (that is, a waveform that represents transition of a CCV during constant-current charging of module $M_D$). Information manager 112 receives a result of detection by sensor module 530. During constant-current charging of module $M_D$, sensor module 530 successively detects a voltage (that is, a CCV) of module $M_D$ and successively outputs the detected CCV to information manager 112. The CCV charging waveform is input to information manager 112. In this embodiment, charging and discharging controller 111 controls charger-discharger 520 to carry out constant-current charging of module $M_D$ under a condition of a current value of 2 A. The CCV charging waveform during initial charging of module $M_D$ is thus input to information manager 112. The condition for constant-current charging (for example, a current value) is not limited to the above and any condition can be set.

Information manager 112 detects the CCV of module $M_D$ in real time based on the output from sensor module 530 and has storage 120 record the CCV charging waveform that represents transition of the CCV of module $M_D$. When information manager 112 finishes obtaining the CCV charging waveform, it uses the CCV charging waveform recorded in storage 120 to generate inspection image data, and has storage 120 store the generated inspection image data. The inspection image data is data that represents a numeric value for each pixel in an image where the CCV charging waveform is drawn in a region constituted of a predetermined number of pixels, and corresponds to input data to be provided to a trained neural network which will be described later. A graph format and an image format of the inspection image data are the same as those of a training image (see FIG. 6) which will be described later. Charging and discharging controller 111, information manager 112, power supply apparatus 510, charger-discharger 520, and sensor module 530 according to this embodiment correspond to an exemplary "charging apparatus" according to the present disclosure. Information manager 112 according to this embodiment corresponds to an exemplary "first generation device" according to the present disclosure.

Control device 210 includes an information manager 211, a capacity estimator 212, and a sorter 213. Each of these components is implemented, for example, by a processor and a program executed by the processor. Without being limited as such, each of these components may be implemented by dedicated hardware (electronic circuitry).

Information manager 211 obtains inspection image data for module $M_D$ from measurement apparatus 100. Control device 110 of measurement apparatus 100 generates inspection image data for module $M_D$ as above, for example, in response to a request from a user and transmits the generated inspection image data to control device 210 through communication apparatuses 130 and 230. Information manager 211 then receives the inspection image data transmitted from control device 110 to control device 210.

Capacity estimator 212 estimates the full charge capacity of module $M_D$ by inputting the inspection image data obtained for module $M_D$ into an input layer of a trained neural network. The trained neural network is stored in storage 220. Sorter 213 determines an application of module $M_D$ based on the full charge capacity of module $M_D$ estimated by capacity estimator 212. Capacity estimator 212 and sorter 213 according to this embodiment correspond to an exemplary "estimation device" and an exemplary "sorting device" according to the present disclosure, respectively.

Figure 5:
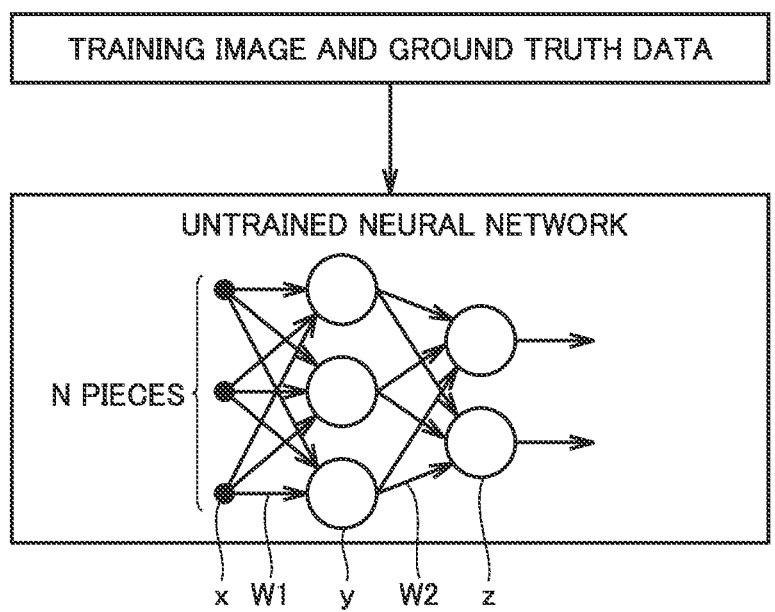
FIG. 5 is a diagram for illustrating training of a neural network according to the embodiment of the present disclosure.

FIG. 5 is a diagram for illustrating training of a neural network. Referring to FIG. 5, a trained neural network is obtained by appropriately training an untrained neural network. In this embodiment, management entity 30 obtains a trained neural network by supervised machine learning of an untrained neural network. In this embodiment, the untrained neural network refers to a general-purpose machine learning algorithm, and the trained neural network functions as an estimation model that estimates the full charge capacity of the secondary battery.

The neural network includes an input layer x, a hidden layer y, and an output layer z. Each of a training image and inspection image data are input to input layer x. Input layer x includes nodes corresponding in number (N) to the number of pixels in the training image (and the inspection image data). The number of nodes of output layer z is determined in accordance with the number of necessary outputs. For example, when output layer z includes 101 nodes, output layer z can output a result of estimation of the full charge capacity in increments of 0.1 Ah within a range from 0 Ah to 10 Ah, output a result of estimation of the full charge capacity in increments of 0.1 Ah within a range from 15 Ah to 25 Ah, or output a result of estimation of the full charge capacity in increments of 0.2 Ah within a range from 0 Ah to 20 Ah. Though any number of nodes of output layer z can be set, the number of nodes of output layer z is set to 71 in this embodiment.

The inventors of the present application have noted correlation of each of a CCV charging waveform and a CCV discharging waveform with the full charge capacity. The CCV charging waveform refers to a CCV waveform that represents transition of a CCV during constant-current charging of a secondary battery. The CCV discharging waveform refers to a CCV waveform that represents transition of a CCV during constant-current discharging of a secondary battery.

In this embodiment, an untrained neural network is subjected to supervised machine learning by using as teaching data, a CCV charging waveform training image and ground truth data (that is, data on an actually measured full charge capacity of the secondary battery). The CCV charging waveform training image is a training image that expresses a CCV charging waveform of a secondary battery in prescribed graph format and image format. The trained neural network with which the full charge capacity of the secondary battery can highly accurately be estimated with the image data of the CCV charging waveform (more specifically, image data expressed in a graph format and an image format the same as those for the CCV charging waveform training image) being used as input data is thus obtained. In addition, in this embodiment, an untrained neural network is subjected to supervised machine learning by using as teaching data, a CCV discharging waveform training image and ground truth data (that is, data on an actually measured full charge capacity of the secondary battery). The CCV discharging waveform training image is a training image that expresses a CCV discharging waveform of a secondary battery in prescribed graph format and image format. The trained neural network with which the full charge capacity of the secondary battery can highly accurately be estimated with the image data of the CCV discharging waveform (more specifically, image data expressed in a graph format and an image format the same as those for the CCV discharging waveform training image) being used as input data is thus obtained.

Figure 6:
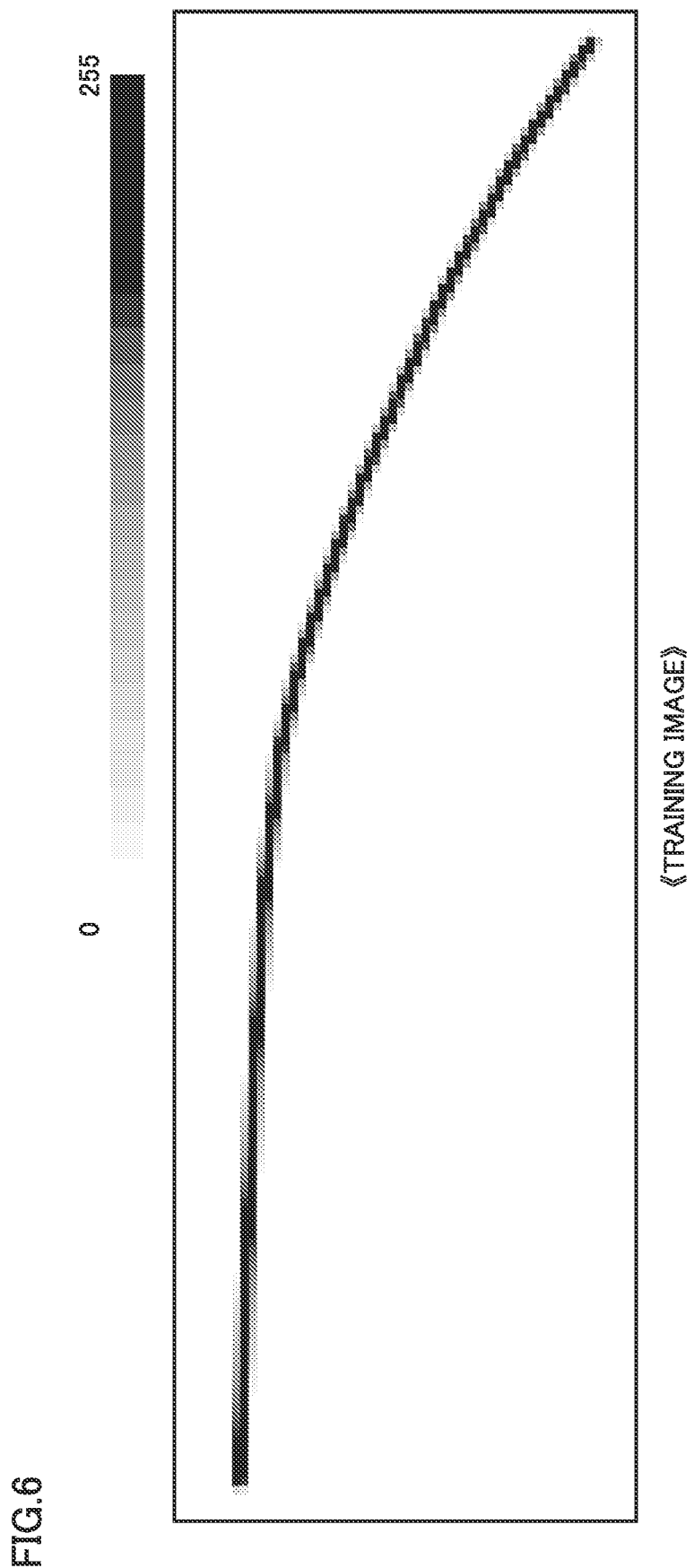
FIG. 6 is a diagram showing an exemplary training image used in training of the neural network shown in FIG. 5.

FIG. 6 is a diagram showing an exemplary training image used in training of a neural network. The training image shown in FIG. 6 is data that represents a numeric value (that is, a pixel value) for each pixel in an image where a CCV discharging waveform is drawn in a region constituted of a predetermined number of pixels. The region where the CCV waveform is drawn is also referred to as an "image region" below. The number of pixels in the image region is set, for example, to approximately 12000. In an exemplary image region, the number of pixels in a vertical direction is set to approximately sixty and the number of pixels in a horizontal direction is set to approximately two hundred. In the training image shown in FIG. 6, density of black and white (from white to black) is expressed in a 256-level (0 to 255) gray scale. A pixel value of 0 represents white and a pixel value of 255 represents black. Each pixel value in the image region takes any value from 0 to 255 and a value of the pixel increases as the pixel is close to black. In this training image, the abscissa represents time and the ordinate represents the CCV. The value of the pixel at a position closer to data of actual measurement (for example, a detection value from sensor module 530 shown in FIG. 4) is larger. CCVs identical in time on the abscissa are expressed, for example, by two to three pixels. According to such graph format and image format, the CCV waveform (that is, transition of the CCV) can highly accurately be expressed even though the number of pixels is small.

The graph format and the image format of the training image are described above with reference to an exemplary CCV discharging waveform training image shown in FIG. 6. The CCV discharging waveform training image and the CCV charging waveform training image are identical to each other in graph format and image format except for the CCV waveform drawn in the image region. Therefore, the CCV charging waveform training image is not shown.

Figure 7:
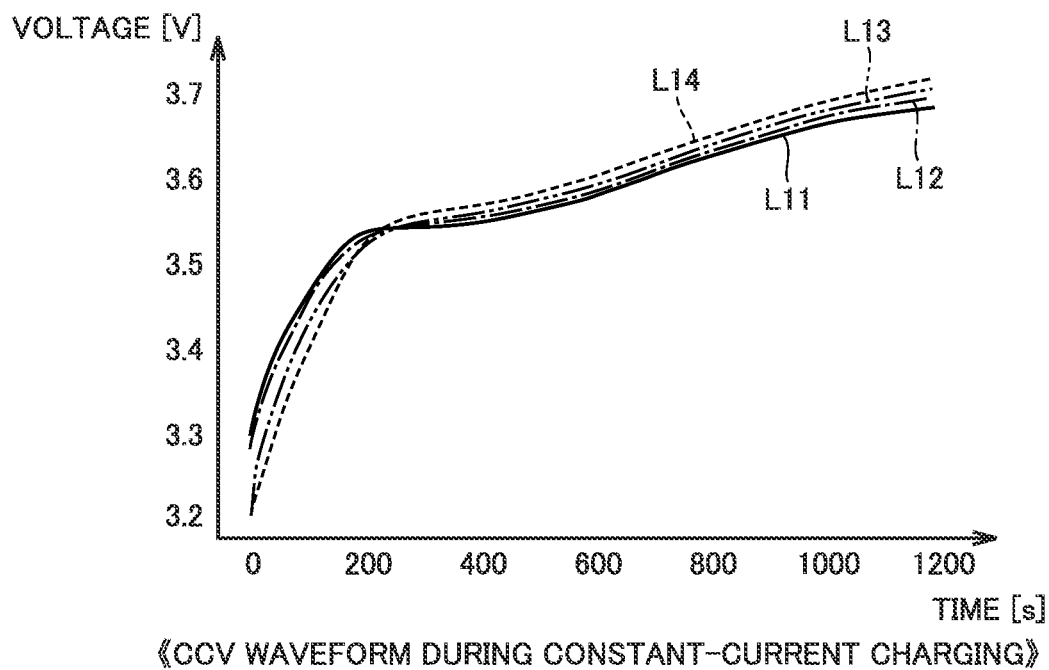
FIG. 7 is a diagram showing four CCV charging waveforms measured for a lithium ion battery in Example of the present disclosure.

FIG. 7 is a diagram showing four CCV charging waveforms (that is, CCV waveforms during constant-current charging) measured for a lithium ion battery. The full charge capacity of the lithium ion battery is lower as deterioration of the lithium ion battery proceeds. The inventors of the present application have measured CCV charging waveforms of a non-aqueous electrolyte solution lithium ion battery with an initial capacity of 21 Ah at timing when the full charge capacity of the lithium ion battery deteriorates to a measurement point (20 Ah, 19 Ah, 18 Ah, and 17 Ah) while the lithium ion battery is used in an electrically powered vehicle to deteriorate. In FIG. 7, lines L11, L12, L13, and L14 represent CCV charging waveforms measured at time points when the full charge capacity of the lithium ion battery attains to 20 Ah, 19 Ah, 18 Ah, and 17 Ah, respectively. As shown in FIG. 7, the CCV charging waveform correlates with the full charge capacity.

Figure 8:
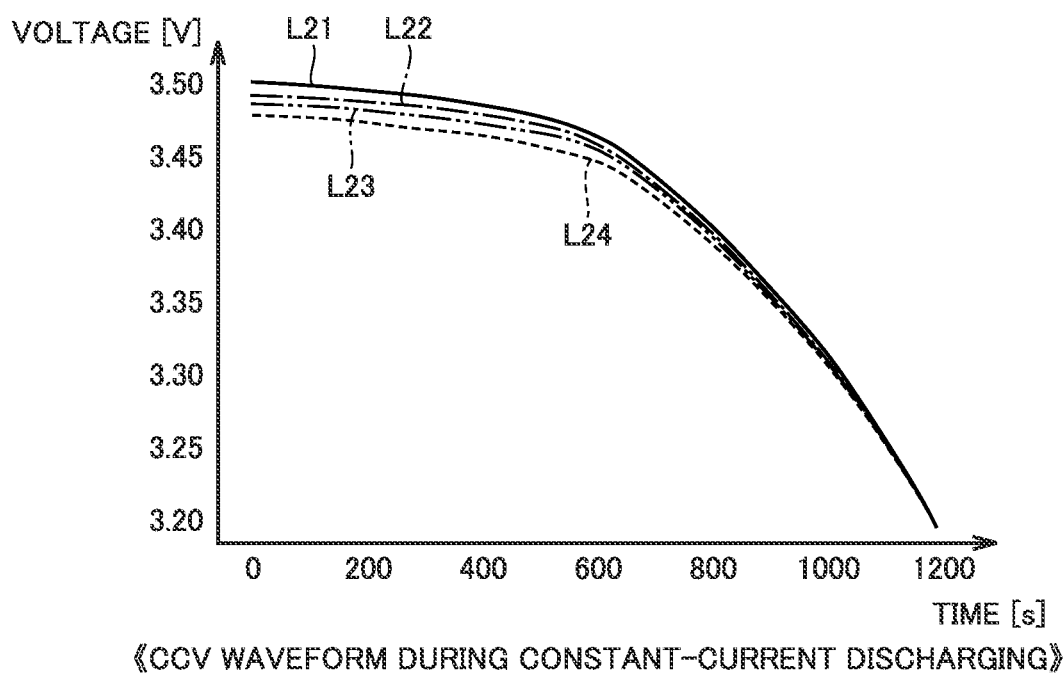
FIG. 8 is a diagram showing four CCV discharging waveforms measured for a lithium ion battery in Example of the present disclosure.

FIG. 8 is a diagram showing four CCV discharging waveforms (that is, CCV waveforms during constant-current discharging) measured for a lithium ion battery. The inventors of the present application have measured CCV discharging waveforms of a non-aqueous electrolyte solution lithium ion battery with an initial capacity of 21 Ah at timing when the full charge capacity of the lithium ion battery deteriorates to a measurement point (20 Ah, 19 Ah, 18 Ah, and 17 Ah) while the lithium ion battery is used in an electrically powered vehicle to deteriorate. In FIG. 8, lines L21, L22, L23, and L24 represent CCV discharging waveforms measured at time points when the full charge capacity of the lithium ion battery attains to 20 Ah, 19 Ah, 18 Ah, and 17 Ah, respectively. As shown in FIG. 8, the CCV discharging waveform correlates with the full charge capacity.

Referring again to FIG. 5, a weight W1 between input layer x and hidden layer y and a weight W2 between hidden layer y and output layer z are adjusted such that a target output from the neural network and an actual output match with each other by supervised machine learning of the neural network using the teaching data described previously. By repeating adjustment of weights W1 and W2 by a teaching signal, accuracy in estimation of a capacity by using the neural network can be enhanced.

The inventors of the present application evaluated, with a method which will be described below, accuracy in estimation of a capacity by using each of a first trained NN and a second trained NN. The first trained NN is a trained neural network trained to estimate a full charge capacity of a nickel metal hydride battery with an initial capacity of 7 Ah based on image data of CCV charging waveforms. The second trained NN is a trained neural network trained to estimate a full charge capacity of a non-aqueous electrolyte solution lithium ion battery with an initial capacity of 21 Ah based on image data of CCV discharging waveforms.

The inventors of the present application prepared 336 pieces of evaluation data for each trained NN. For evaluation data for evaluating the first trained NN, an image for evaluation of the CCV charging waveforms and ground truth data (that is, an actually measured value of the full charge capacity) of the nickel metal hydride battery with the initial capacity of 7 Ah were prepared. For evaluation data for evaluating the second trained NN, an image for evaluation of the CCV discharging waveforms and ground truth data (that is, an actually measured value of the full charge capacity) of the non-aqueous electrolyte solution lithium ion battery with the initial capacity of 21 Ah were prepared. The inventors of the present application inputted the evaluation image into the trained NN (that is, the first trained NN or the second trained NN) and obtained an output value from the trained NN (that is, an estimated value of the full charge capacity). The inventors of the present application calculated an absolute value of a difference (which is referred to as an "absolute error" below) between the output value from the trained NN and the actually measured value of the full charge capacity. The inventors of the present application calculated the absolute error for each piece of evaluation data and obtained 336 absolute errors. The inventors of the present application calculated a ratio (which is also referred to as an "evaluation result A" below) of the number of absolute errors equal to or smaller than 0.5 Ah of the 336 absolute errors, and further calculated an average value (which is also referred to as an "evaluation result B" below) of the 336 absolute errors. In evaluation, accuracy in estimation of the capacity by using the trained NN is evaluated from two points of view. As evaluation result A exhibits a higher ratio and evaluation result B exhibits a smaller value, accuracy in estimation of a capacity by using the trained NN is evaluated as being higher.

Figure 9:
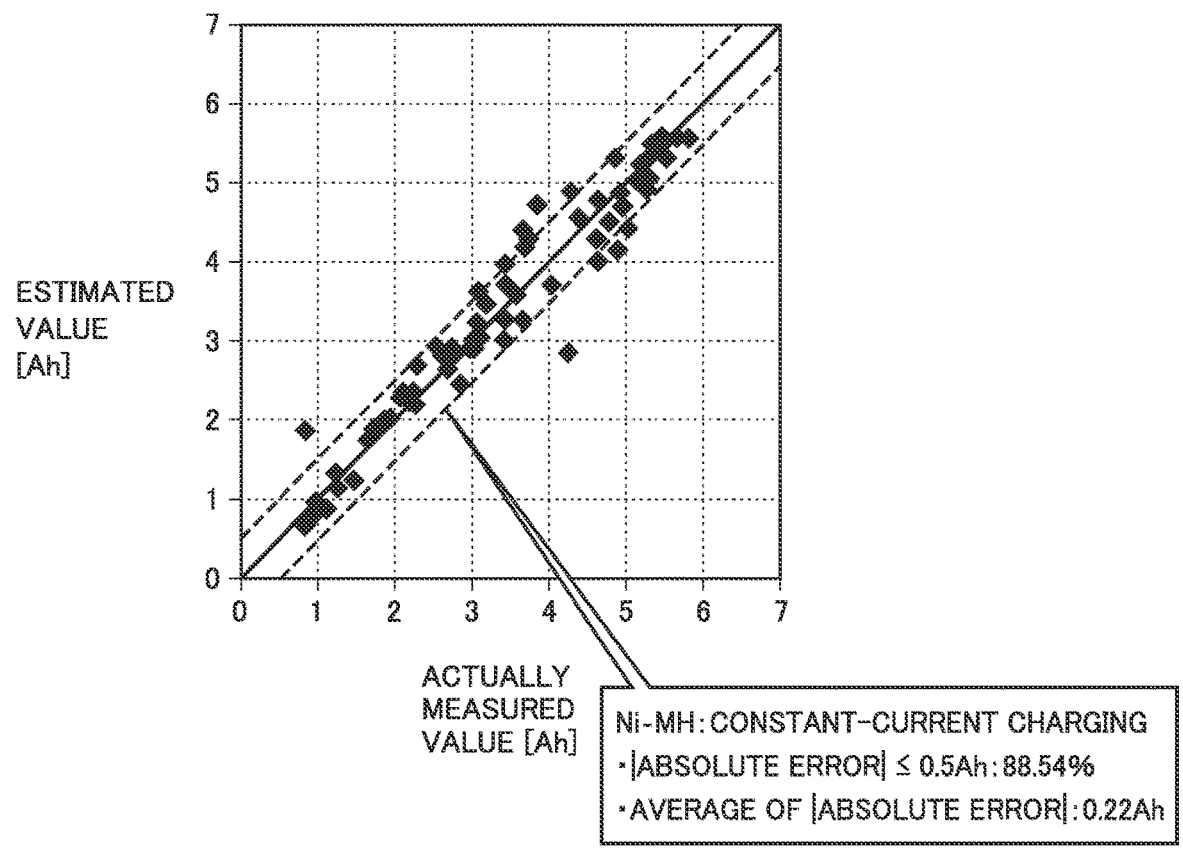
FIG. 9 is a diagram showing a result of evaluation of a first trained NN according to Example of the present disclosure.

FIG. 9 is a diagram showing a result of evaluation of the first trained NN. Referring to FIG. 9, in evaluation of the first trained NN, evaluation result A was 88.54% and evaluation result B was 0.22 Ah. By thus using the first trained NN, the full charge capacity of the secondary battery (more specifically, the nickel metal hydride battery with the initial capacity of 7 Ah) could highly accurately be estimated.

Figure 10:
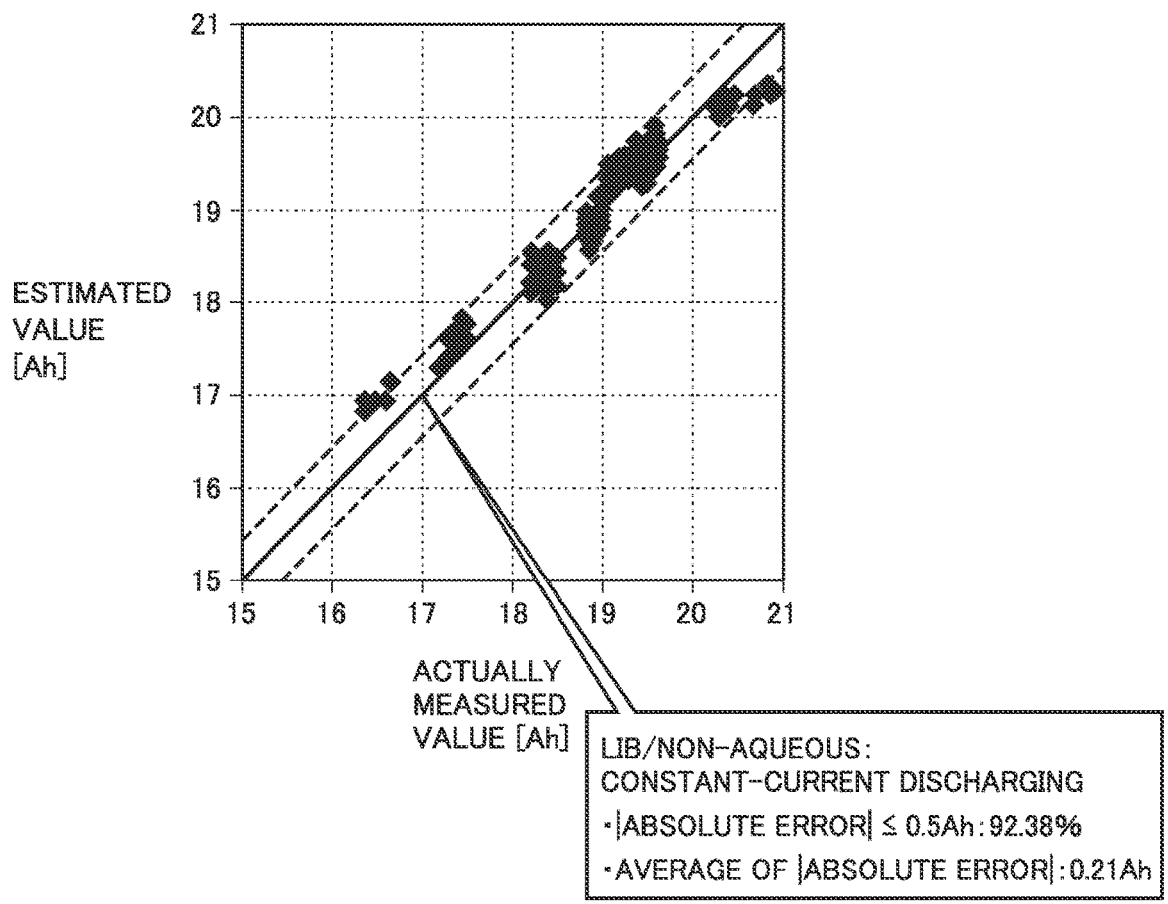
FIG. 10 is a diagram showing a result of evaluation of a second trained NN according to Example of the present disclosure.

FIG. 10 is a diagram showing a result of evaluation of the second trained NN. Referring to FIG. 10, in evaluation of the second trained NN, evaluation result A was 92.38% and evaluation result B was 0.21 Ah. By thus using the second trained NN, the full charge capacity of the secondary battery (more specifically, the non-aqueous electrolyte solution lithium ion battery with the initial capacity of 21 Ah) could highly accurately be estimated.

In this embodiment, a trained neural network (which is also referred to as a "charging type NN" below) that includes an input layer that accepts first input data that represents a numeric value for each pixel in an image where a CCV charging waveform of the secondary battery is drawn in a region constituted of a predetermined number of pixels and outputs a full charge capacity of the secondary battery when the first input data is input to the input layer is used. The first trained NN described above corresponds to an exemplary charging type NN. By training as described above, however, a trained neural network (which is also referred to as a "discharging type NN" below) that includes an input layer that accepts second input data that represents a numeric value for each pixel in an image where a CCV discharging waveform of a secondary battery is drawn in a region constituted of a predetermined number of pixels and outputs a full charge capacity of the secondary battery when the second input data is input to the input layer can also be generated. The second trained NN described above corresponds to an exemplary discharging type NN. An embodiment (a modification) using the discharging type NN will be described later.

Referring again to FIG. 4, the trained neural network that allows sufficiently high accuracy in estimation of a capacity as a result of training as described above is stored in storage 220. In this embodiment, a plurality of trained neural networks are stored in storage 220. The plurality of trained neural networks are managed as being distinguished from one another based on a battery manufacturer and a model (see FIG. 11 which will be described later). Conditions for manufacturing of a battery are different for each battery manufacturer. The model represents a structure (for example, a dimension, a shape, and a material) and an initial capacity of a battery. A plurality of batteries being identical in battery manufacturer and model means that the structure, the initial capacity, and the conditions for manufacturing of the batteries are substantially the same. Each trained neural network is a neural network trained by using secondary batteries corresponding in battery manufacturer and model. Each of the plurality of trained neural networks stored in storage 220 corresponds to an exemplary charging type NN. The neural network may be denoted as "NN" below.

Storage 220 stores information (which is also referred to as "NN information" below) that associates a battery manufacturer and a model with a trained NN. FIG. 11 is a diagram showing exemplary NN information. Referring to FIG. 11, NN information associates a battery manufacturer and a model with a trained NN (NX-1, NX-2, NY-1, . . . ). The NN information shown in FIG. 11 includes information on each trained NN (for example, a training condition). Examples of the training condition include a graph format and an image format of input data, a charging rate during training, and a temperature during training.

Referring again to FIG. 4, storage 220 stores information (which is also referred to as "battery information" below) on each module M stored in storage space 500 as being distinguished based on the M-ID. FIG. 12 is a diagram showing exemplary battery information. Referring to FIG. 12, the battery information includes, for example, a battery manufacturer, a model, a battery material (a non-aqueous electrolyte solution lithium ion battery, a nickel metal hydride battery, an all-solid-state lithium ion battery, . . . ), and an initial capacity. The battery information may further include information not shown in FIG. 12 (for example, a dimension and a shape of a battery).

Referring again to FIG. 4, control device 210 controls display apparatus 250 to show, in response to a request from a user, at least one of the NN information (see, for example, FIG. 11) and the battery information (see, for example, FIG. 12). The user can check information on each trained NN stored in storage 220 and information on each module M stored in storage space 500 by giving an instruction to control device 210 through input apparatus 240.

When any of a plurality of modules M stored in storage space 500 is to be shipped, the user connects that to-be-shipped module M to charger-discharger 520. Module M connected to charger-discharger 520 is handled as module $M_D$ (the target battery). The user requests control device 210 to sort module $M_D$ through input apparatus 240, before shipment of module $M_D$. At this time, the user inputs the M-ID of module $M_D$ to control device 210. Information manager 211 of control device 210 requests control device 110 of measurement apparatus 100 to transmit inspection image data, in response to the request from the user. Control device 110 controls charger-discharger 520 to carry out constant-current charging of module $M_D$ in response to the request from information manager 211, generates inspection image data from outputs from sensor module 530, and transmits the generated inspection image data to information manager 211. Information manager 211 sends the received inspection image data to capacity estimator 212.

Capacity estimator 212 obtains the battery manufacturer and the model of module $M_D$ from the battery information in storage 220 and the M-ID input by the user. Capacity estimator 212 then selects one trained NN corresponding to the battery manufacturer and the model of module $M_D$, from among the plurality of trained NNs stored in storage 220, by referring to the NN information in storage 220. The trained NN adapted to module $M_D$ is thus selected. Thereafter, capacity estimator 212 estimates the full charge capacity of module $M_D$ by inputting the inspection image data for module $M_D$ received from information manager 211 into the input layer of the trained NN selected as above.

The full charge capacity (a result of estimation) of module $M_D$ estimated by capacity estimator 212 is sent from capacity estimator 212 to sorter 213. Sorter 213 determines an application of module $M_D$ based on the result of estimation. Sorter 213 writes the determined application into the battery information in storage 220 and sends the application to information manager 211. When information manager 211 receives the application of module $M_D$, it has display apparatus 250 show the application. The user looks at a screen on display apparatus 250 to know the result of sorting (that is, the application of module $M_D$), and ships module $M_D$ in accordance with the result of sorting.

Figure 13:
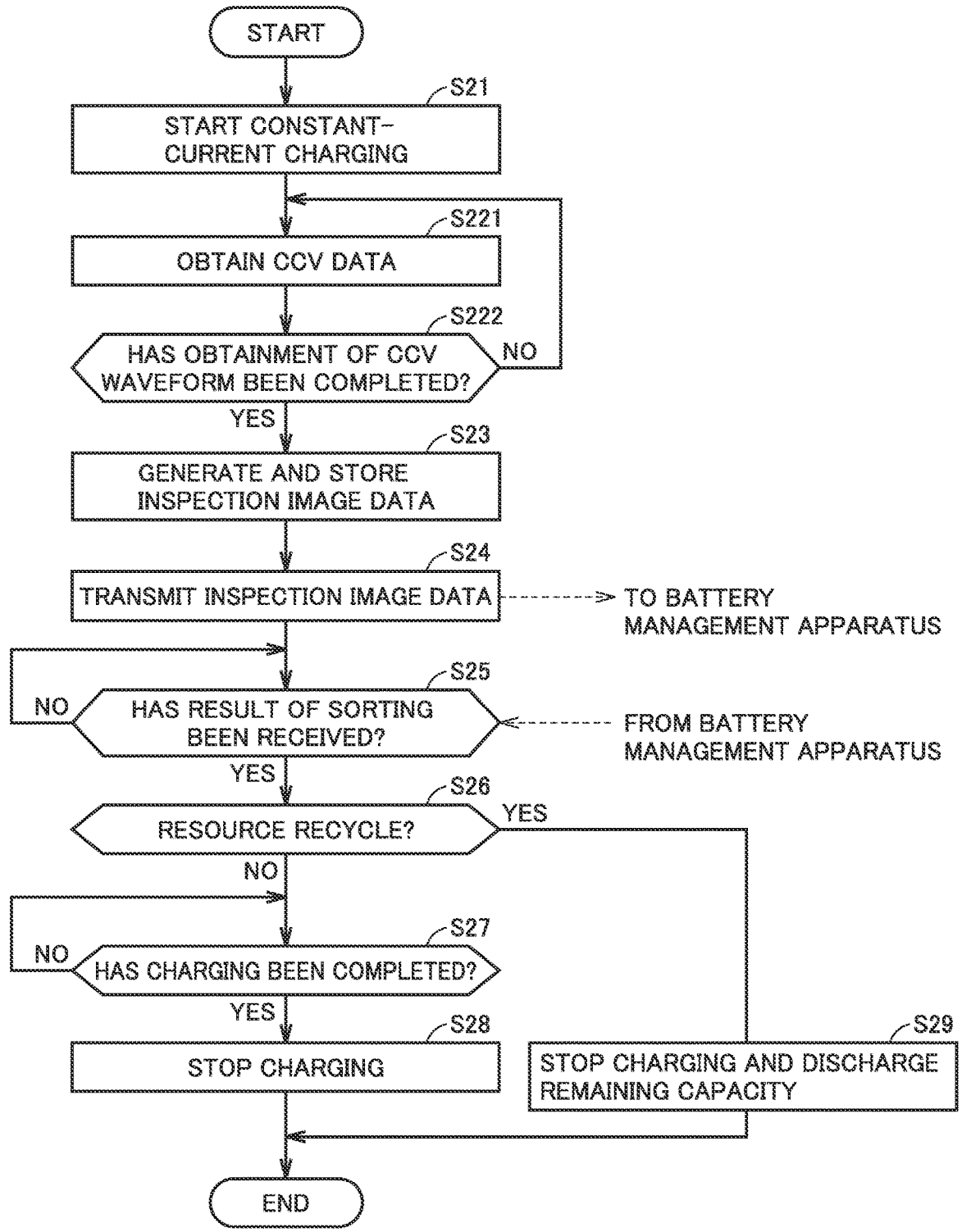
FIG. 13 is a flowchart showing processing performed by a measurement apparatus in a battery management method according to the embodiment of the present disclosure.

FIG. 13 is a flowchart showing processing performed by control device 110 of measurement apparatus 100 in response to a request from information manager 211 of battery management apparatus 200. Processing shown in this flowchart is started when information manager 211 requests control device 110 to transmit inspection image data in S31 in FIG. 14 which will be described later.

Referring to FIG. 13 together with FIG. 4, in S21, charging and discharging controller 111 starts constant-current charging of module $M_D$. A condition (for example, a charging rate) in constant-current charging may be predetermined or designated by a user.

In S221, information manager 112 obtains an output (including a CCV of module $M_D$) from sensor module 530 during constant-current charging and has storage 120 record the output. In S222, information manager 112 determines whether or not it has completed obtainment of a CCV charging waveform. During a period until obtainment of the CCV charging waveform is completed (that is, during a period over which determination as NO is made in S222), S221 and S222 are repeatedly performed. In this embodiment, when an SOC of module $M_D$ exceeds a prescribed SOC value (for example, 5%), determination as YES (obtainment of the CCV charging waveform having been completed) is made in S222 and the process proceeds to S23. The condition for determination in S222, however, is not limited to the above. For example, when a prescribed time period (for example, 1200 seconds) has elapsed since start of constant-current charging in S21, information manager 112 may make determination as YES in S222. In this embodiment, S21, S221, and S222 in FIG. 13 correspond to an exemplary "first step" according to the present disclosure.

In S23, information manager 112 generates inspection image data from the CCV charging waveforms recorded in storage 120 and has storage 120 store the generated inspection image data. In this embodiment, S23 in FIG. 13 corresponds to an exemplary "second step" according to the present disclosure.

In S24, information manager 112 transmits the inspection image data generated in S23 to battery management apparatus 200. Thereafter, information manager 112 stands by in S25 until it receives a result of sorting (that is, a result of sorting transmitted in S37 in FIG. 14 which will be described later) from battery management apparatus 200. Charging started in S21 is continued also while the information manager stands by in S25 (that is, during a period over which determination as NO is made in S25). Though charging is continued without change in condition for charging after start of charging in S21 in this embodiment, the condition for charging may be changed at the timing when determination as YES is made in S222. For example, control device 110 may increase the charging rate.

When information manager 112 receives the result of sorting from battery management apparatus 200 (YES in S25), the process proceeds to S26. In this embodiment, module $M_D$ is sorted into any of use of parts/rebuild/resource recycle based on the result of sorting. In S26, charging and discharging controller 111 determines whether or not module $M_D$ has been sorted into resource recycle.

When determination as NO (module $M_D$ having been sorted into use of parts or rebuild) is made in S26, in S27, charging and discharging controller 111 determines whether or not a condition for completion of charging is satisfied. During a period over which the condition for completion of charging is not satisfied (that is, during a period over which determination as NO is made in S27), charging and discharging controller 111 continues charging of module $M_D$. In this embodiment, when the SOC of module $M_D$ attains to an SOC (for example, an SOC corresponding to a fully charged state) suitable for an application (more specifically, an application determined in S36 which will be described later), determination as YES (the condition for completion of charging having been satisfied) is made in S27, and in S28, charging and discharging controller 111 stops charging of module $M_D$. As processing in S28 is performed, a series of processing in FIG. 13 ends.

When determination as YES (module $M_D$ having been sorted into resource recycle) is made in S26, charging and discharging controller 111 stops charging of module $M_D$ and controls charger-discharger 520 to carry out remaining capacity discharging of module $M_D$. As processing in S29 is performed, the series of processing in FIG. 13 ends.

Figure 14:
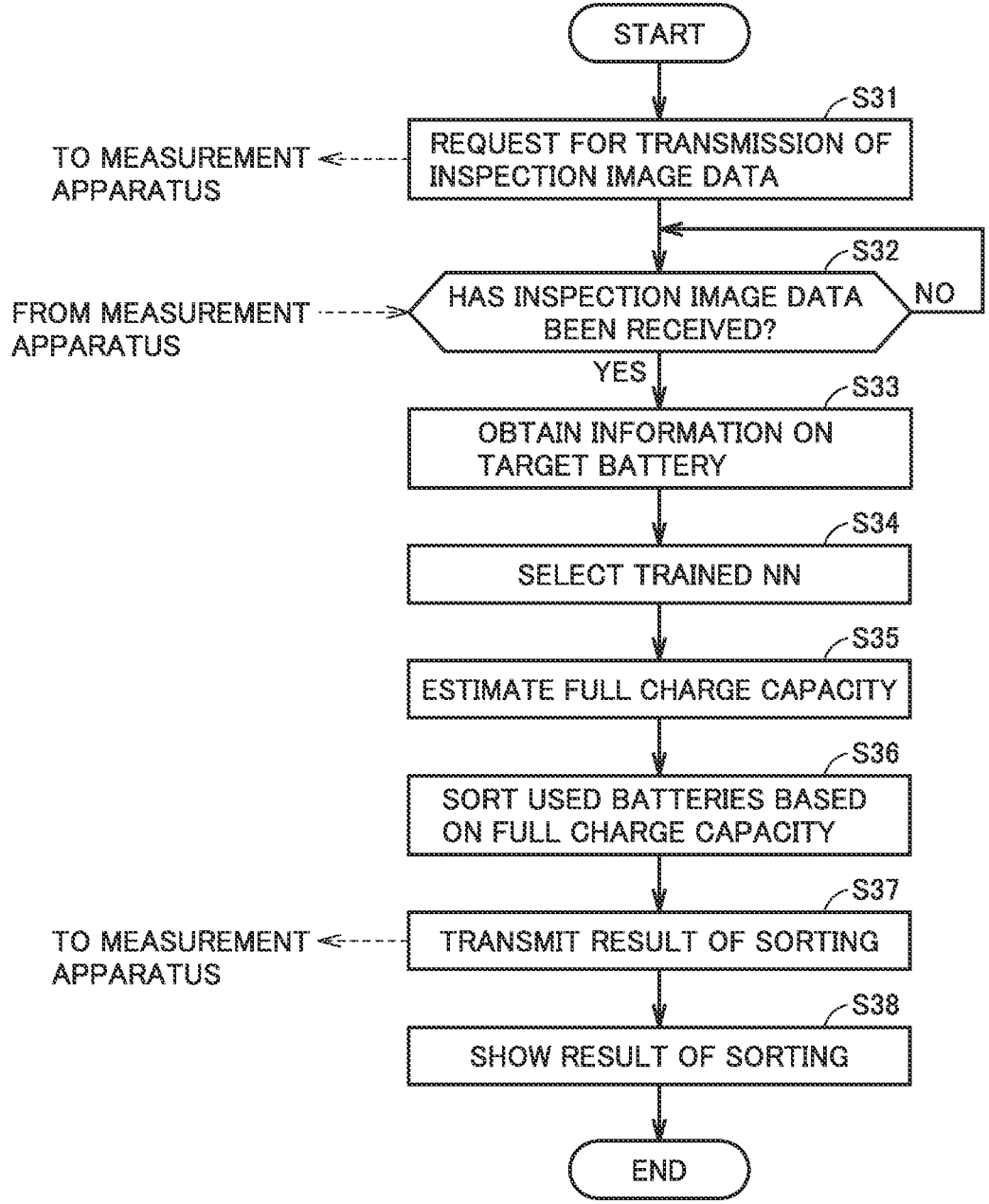
FIG. 14 is a flowchart showing processing performed by the battery management apparatus in the battery management method according to the embodiment of the present disclosure.

FIG. 14 is a flowchart showing processing performed by control device 210 of battery management apparatus 200 in response to a request from a user. Processing shown in this flowchart is started when the user inputs the M-ID of module $M_D$ into control device 210 and requests for sorting of module $M_D$.

Referring to FIG. 14 together with FIG. 4, in S31, information manager 211 transmits a signal that requests for transmission of inspection image data for module $M_D$ to measurement apparatus 100. Thereafter, information manager 211 stands by in S32 until it receives inspection image data (that is, inspection image data transmitted in S24 in FIG. 13) from measurement apparatus 100.

When information manager 211 receives the inspection image data for module $M_D$ from measurement apparatus 100 (YES in S32), the process proceeds to S33. In S33, capacity estimator 212 obtains the battery manufacturer and the model of module $M_D$ from the battery information in storage 220 and the M-ID input by the user. In S34, capacity estimator 212 selects one trained NN corresponding to the battery manufacturer and the model of module $M_D$, from among the plurality of trained NNs stored in storage 220, by referring to the NN information in storage 220. In S35, capacity estimator 212 estimates the full charge capacity of module $M_D$ by inputting the inspection image data for module $M_D$ received from measurement apparatus 100 into the input layer of the trained NN selected in S34.

Figure 15:
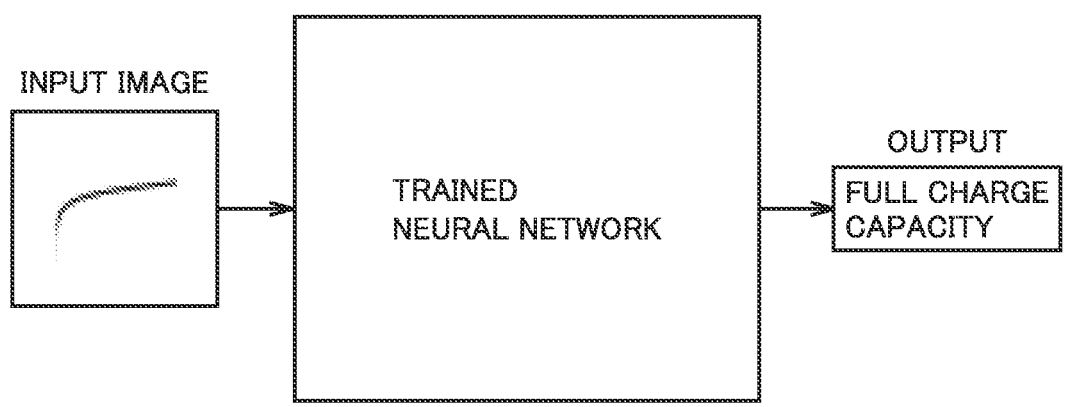
FIG. 15 is a diagram showing overview of estimation of a full charge capacity by using a trained NN in the battery management method according to the embodiment of the present disclosure.

FIG. 15 is a diagram showing overview of estimation of a full charge capacity by using a trained NN. As shown in FIG. 15, when inspection image data (an input image) of module $M_D$ is input to the input layer of the trained NN in S35 in FIG. 14, the full charge capacity of module $M_D$ is output from the output layer of the trained NN. In this embodiment, S35 in FIG. 14 corresponds to an exemplary "third step" and an exemplary "fourth step" according to the present disclosure.

Referring again to FIG. 14 together with FIG. 4, in S36, sorter 213 sorts module $M_D$ based on the full charge capacity thereof estimated in S35. Module $M_D$ is sorted based on an application thereof. Then, sorter 213 has storage 220 store a result of sorting (that is, an application of module $M_D$).

In S36, sorter 213 initially sorts module $M_D$ into any of use of parts/rebuild/resource recycle. For example, when the full charge capacity of module $M_D$ is lower than a first threshold value, sorter 213 determines the application of module $M_D$ as "resource recycle." When the full charge capacity of module $M_D$ is equal to or higher than the first threshold value and lower than a second threshold value, sorter 213 determines the application of module $M_D$ as "battery for households (use of parts)." When the full charge capacity of module $M_D$ is equal to or higher than the second threshold value and lower than a third threshold value, sorter 213 determines the application of module $M_D$ as "battery for factories (use of parts)." When the full charge capacity of module $M_D$ is equal to or higher than the third threshold value, sorter 213 determines the application of module $M_D$ as "rebuild." The first to third threshold values satisfy such relation as "the first threshold value <the second threshold value <the third threshold value." This is one manner of sorting and can be modified as appropriate. For example, a secondary battery low in full charge capacity may be allocated to "rebuild". Sorter 213 may sort the module only into partial reuse/resource recycle based on the estimated full charge capacity of module $M_D$.

In S37, information manager 211 transmits the application determined in S36 to measurement apparatus 100, and in S38, it has display apparatus 250 show the application. Display apparatus 250 may show the full charge capacity estimated in S35 together with the application. As the processing in S38 is performed, a series of processing in FIG. 14 ends.

Figure 16:
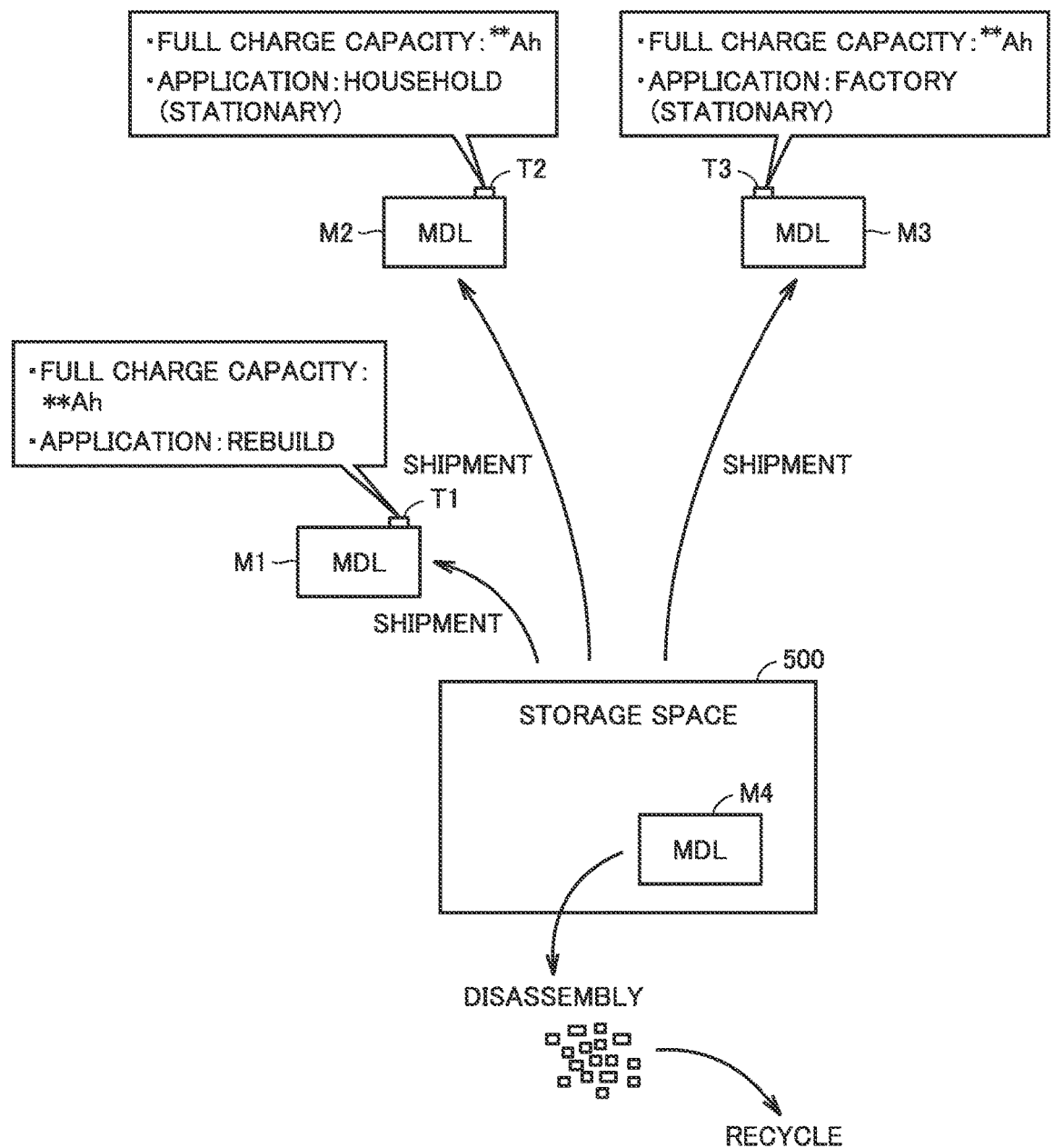
FIG. 16 is a diagram showing a manner of shipment of a target battery according to the embodiment of the present disclosure.

A user checks the result of sorting (that is, the application of module $M_D$) shown as a result of the processing in S38 and ships module $M_D$ in accordance with the result of sorting. FIG. 16 is a diagram showing an exemplary manner of shipment of module $M_D$. In FIG. 16, modules M1, M2, M3, and M4 are modules sorted into "rebuild," "battery for households (use of parts)," "battery for factories (use of parts)," and "resource recycle" in S36 in FIG. 14, respectively.

Referring to FIG. 16, tags T1 to T3 are attached to modules M1 to M3, respectively. Tags T1 to T3 may be attached at timing of shipment of modules M1 to M3 or timing when modules M1 to M3 are put into storage space 500 (for example, S11 in FIG. 3). Each of tags T1 to T3 according to this embodiment is an IC tag that stores the M-ID, the full charge capacity, and the application of the corresponding module. For example, a radio frequency identification (RFID) tag can be adopted as the IC tag. Battery management apparatus 200 may read and rewrite information stored in each of tags T1 to T3 through wireless communication. Battery management apparatus 200 may write the determined application into tags T1 to T3 when the application of modules M1 to M3 is determined in S36 in FIG. 14.

Modules M1 to M3 are each shipped to a destination corresponding to the application determined in S36 in FIG. 14. Module M1 is shipped to manufacturer 34 shown in FIG. 1. Modules M2 and M3 are shipped to a distributor of stationary batteries. Module M4 is sent to recycler 36 shown in FIG. 1. Recycler 36 disassembles module M4 into battery materials to thereby reclaim the materials for use as new cells or as source materials for other products.

As described above, in the battery management system according to this embodiment, control device 210 estimates the full charge capacity of module $M_D$ by inputting image data (that is, inspection image data) of CCV charging waveforms obtained for module $M_D$ (target battery) into the input layer of the trained neural network. The method of estimating a capacity according to this embodiment is smaller in man-hours for estimation than the AC-IR method and can allow more simplified estimation. Furthermore, a time period required for estimation is short. According to the battery management system, the full charge capacity of the secondary battery can be estimated highly accurately and quickly in a simplified manner without using a special measurement instrument or performing complicated calculation.

In the embodiment, the secondary battery is stored at a constant temperature (for example, 25° C.), and training and evaluation of a neural network as well as a performance test using the trained neural network are carried out at a storage temperature. All management entities, however, are not necessarily able to store secondary batteries at a constant temperature. In order to highly accurately estimate the full charge capacity of the secondary battery also under a condition where a storage temperature is varied, control device 210 may handle a temperature at the time of obtainment of CCV waveforms of the secondary battery as an explanatory variable when it estimates the full charge capacity (a response variable) of the secondary battery.

The battery management system according to the embodiment estimates the full charge capacity of the secondary battery by using a charging type NN. Without being limited thereto, the battery management system may estimate the full charge capacity of the secondary battery by using a discharging type NN. An embodiment (a modification) that uses a discharging type NN will be described with reference to FIGS. 3, 4, 14, and 17.

Figure 17:
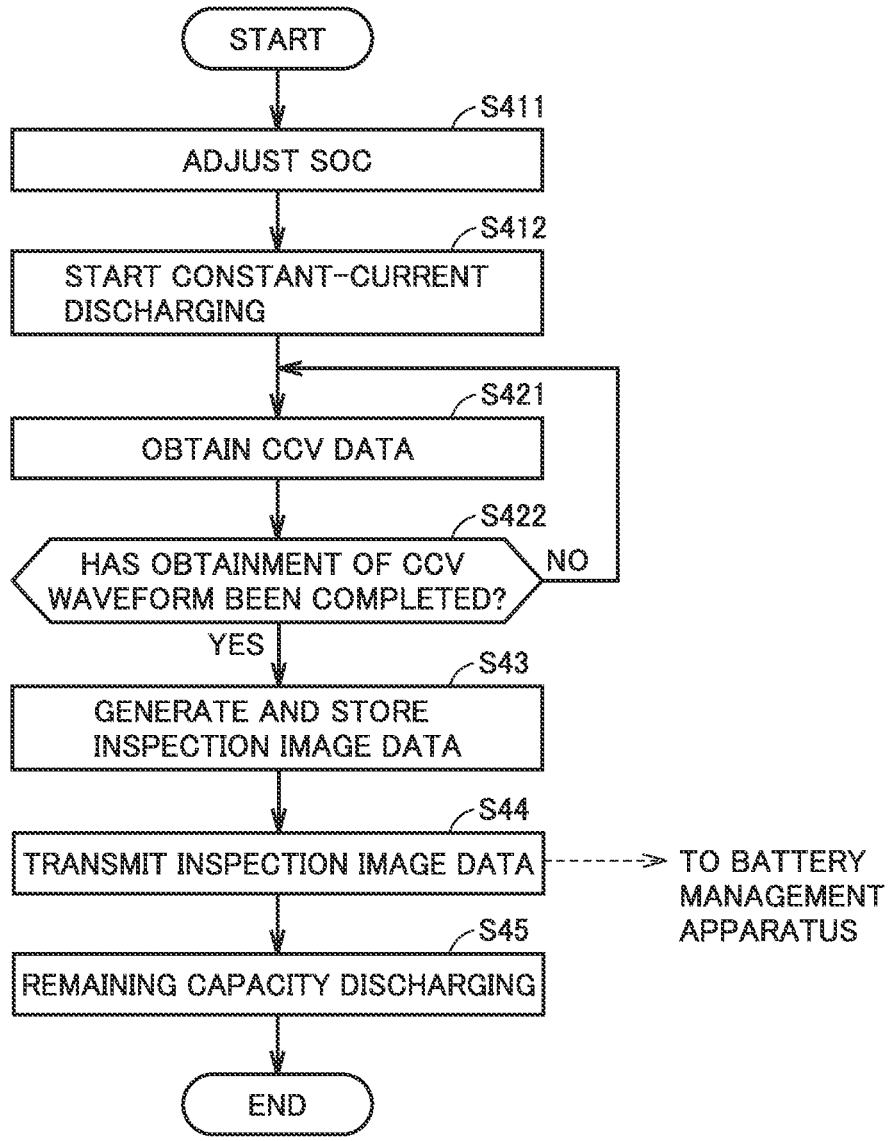
FIG. 17 is a diagram showing a modification of the processing shown in FIG. 13.

Referring to FIG. 3, in this modification, in S12, management entity 30 connects module M collected from a vehicle to charger-discharger 520 instead of automatic discharging apparatus 540. As module M is connected to charger-discharger 520, processing in FIG. 17 is started. Module M connected to charger-discharger 520 is handled as module $M_D$ (target battery).

FIG. 17 is a diagram showing a modification of the processing shown in FIG. 13. Referring to FIG. 17 together with FIG. 4, in S411, charging and discharging controller 111 controls charger-discharger 520 to adjust the SOC of module $M_D$ to a start SOC (for example, an SOC corresponding to a fully charged state) in constant-current discharging. The start SOC in constant-current discharging may have a predetermined value or may be designated by a user.

After processing in S411, in S412, charging and discharging controller 111 starts constant-current discharging of module $M_D$. In this modification, charging and discharging controller 111 controls charger-discharger 520 such that constant-current discharging of module $M_D$ is carried out under a condition of a current value of 2 A. The condition (for example, a current value) for constant-current discharging is not limited as above and can arbitrarily be set. The condition (for example, a discharging rate) in constant-current discharging may be predetermined or designated by a user.

In S421, information manager 112 obtains an output (including a CCV of module $M_D$) from sensor module 530 during constant-current discharging and has storage 120 record the output. In S422, information manager 112 determines whether or not obtainment of CCV discharging waveforms has been completed. During a period until obtainment of CCV discharging waveforms is completed (that is, during a period over which determination as NO is made in S422), S421 and S422 are repeatedly performed. In this modification, when the SOC of module $M_D$ is lower than a prescribed SOC value (for example, 90%), determination as YES (obtainment of CCV discharging waveforms having been completed) is made in S422 and the process proceeds to S43. The condition for determination in S422 is not limited as above. For example, when a prescribed time period (for example, 1200 seconds) has elapsed since start of constant-current discharging in S412, information manager 112 may make determination as YES in S422. Charging and discharging controller 111, information manager 112, power supply apparatus 510, charger-discharger 520, and sensor module 530 (FIG. 4) according to this modification correspond to an exemplary "discharging apparatus" according to the present disclosure.

In S43, information manager 112 generates inspection image data from CCV discharging waveforms recorded in storage 120 and has storage 120 store the generated inspection image data. The inspection image data according to this modification is data that represents a numeric value for each pixel in an image where CCV discharging waveforms are drawn in a region constituted of a predetermined number of pixels, and corresponds to input data to be provided to a trained neural network. Information manager 112 (FIG. 4) according to this modification corresponds to an exemplary "second generation device" according to the present disclosure.

In S44, information manager 112 transmits the inspection image data generated in S43 to battery management apparatus 200. Thereafter, in S45, remaining capacity discharging of module $M_D$ is carried out. For example, remaining capacity discharging of module $M_D$ may be carried out by continuing discharging started in S412 by charging and discharging controller 111. Discharging may be continued without change in condition for discharging after start of discharging in S412, or a condition for discharging may be modified at timing when determination as YES is made in S422. Management entity 30 may carry out remaining capacity discharging of module $M_D$ by removing module $M_D$ from charger-discharger 520 and placing the module onto automatic discharging apparatus 540.

In this modification, a plurality of discharging type NNs are stored in storage 220 shown in FIG. 4. The plurality of discharging type NNs are managed as being distinguished based on the battery manufacturer and the model. Processing in FIG. 14 from which S37 and S38 are omitted is performed by control device 210 of battery management apparatus 200. In S35 in FIG. 14, capacity estimator 212 estimates the full charge capacity of module $M_D$ by inputting the inspection image data (that is, inspection image data transmitted in S44 in FIG. 17) for module $M_D$ received from measurement apparatus 100 into the input layer of the trained NN (more specifically, the discharging type NN) selected in S34.

Module M that has undergone estimation of the full charge capacity and remaining capacity discharging as above is stored in storage space 500 (S13 in FIG. 3). Both of the charging type NN and the discharging type NN may be stored in storage 220 and control device 210 may selectively use the charging type NN and the discharging type NN depending on a target battery.

Figure 18:
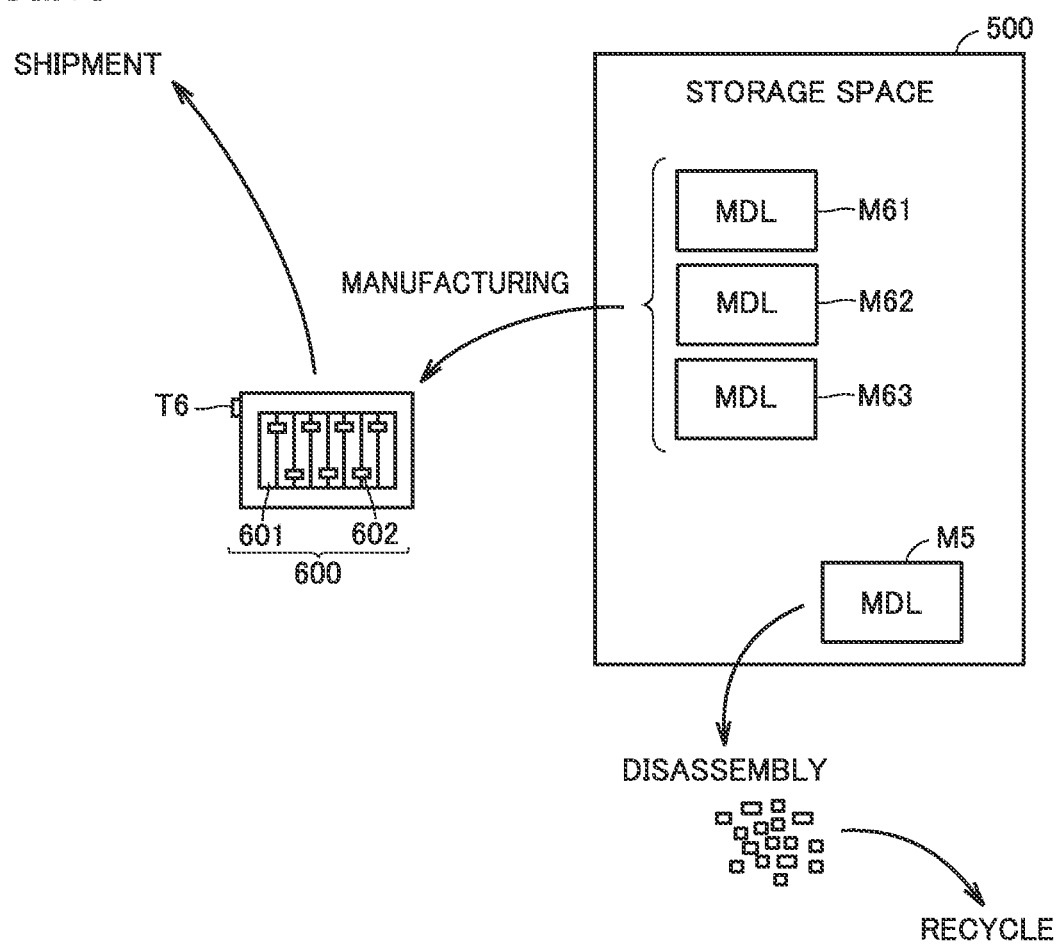
FIG. 18 is a diagram for illustrating a modification of the battery management system.

Storage space 500 and battery management apparatus 200 are provided at the location of management entity 30 in the embodiment. Without being limited thereto, storage space 500 may be provided at the location of manufacturer 34 and battery management apparatus 200 may be mounted on management server 20 shown in FIG. 2. The battery management system described previously may be provided at the location of manufacturer 34 or dealer 35. FIG. 18 is a diagram for illustrating an exemplary battery management system provided at the location of manufacturer 34.

Referring to FIG. 18 together with FIG. 1, manufacturer 34 manufactures a battery assembly 600 (that is, a rebuilt product) by combining modules M61 to M63 (that is, a plurality of modules with a full charge capacity suitable for rebuild) sorted into "rebuild" in S36 in FIG. 14. This step of manufacturing battery assembly 600 corresponds to an exemplary "fifth step" according to the present disclosure. Battery assembly 600 illustrated in FIG. 18 includes a plurality of cells 601. In battery assembly 600, a positive electrode terminal of one cell 601 and a negative electrode terminal of another adjacent cell 601 are electrically connected to each other by a conductive bus bar 602. Cells 601 are connected in series to each other. A battery pack is manufactured by attaching an accessory to such battery assembly 600. To the battery pack, a tag T6 (for example, an RFID tag) that stores information (for example, the M-ID and the full charge capacity) on each module included in battery assembly 600 together with the battery ID of battery assembly 600 is attached. The battery pack including battery assembly 600 thus manufactured is shipped after a shipment inspection. Manufacturer 34 sends a module M5 sorted into "resource recycle" in S36 in FIG. 14 to recycler 36. Recycler 36 reclaims module M5.

The configuration of the battery management system is not limited to the configuration shown in FIG. 4. For example, automatic discharging apparatus 540 does not have to be provided. Instead of charger-discharger 520 that carries out both of charging and discharging, a charging apparatus that carries out only charging or a discharging apparatus that carries out only discharging may be adopted. Battery management apparatus 200 may be mounted on a portable device (for example, a smartphone). It is not essential that measurement apparatus 100 and battery management apparatus 200 are arranged at a distance from each other. Battery management apparatus 200 may be provided in storage space 500 together with measurement apparatus 100. Measurement apparatus 100 and battery management apparatus 200 may be integrated. Any number of trained neural networks or a single trained neural network may be stored in storage 220.

Though control device 110 of measurement apparatus 100 functions as the "first generation device" and the "second generation device" in the embodiment and the modification, control device 210 of battery management apparatus 200 may function as the "first generation device" and the "second generation device." Inspection image data may be generated in battery management apparatus 200.

It is not essential that the battery management system includes a sorting device (that is, the battery management system determines an application of a target battery). A user may determine an application of a target battery (for example, module $M_D$) based on the full charge capacity of the target battery estimated by battery management apparatus 200.

Though an example in which a secondary battery is collected from a vehicle is mentioned in the embodiment, the battery management system may be applied to a secondary battery collected from another mobile body (for example, a ship, an airplane, an automated guided vehicle, an agricultural implement, or a drone), a secondary battery collected from a portable device (that is, an electronic device that can be carried by a user), or a stationary secondary battery. The target battery is not limited to a module, but it may be a cell or a battery assembly. The battery management system may estimate the full charge capacity of the battery assembly at the time of collection of the battery assembly from a vehicle (for example, S11 in FIG. 3) and sort (for example, sort into full reuse/resource recycle) that battery assembly based on the estimated full charge capacity.

Though the embodiment of the present disclosure has been described, it should be understood that the embodiment disclosed herein is illustrative and non-restrictive in every respect. The scope of the present disclosure is defined by the terms of the claims and is intended to include any modifications within the scope and meaning equivalent to the terms of the claims.

What is claimed is:

1. A battery management system that manages information on a secondary battery, the battery management system comprising:

a storage that stores at least one trained model; and an estimation device that estimates, by using the trained model, a full charge capacity of a target battery that is a prescribed secondary battery, the trained model including an input layer that accepts input data, the trained model outputting the full charge capacity of a secondary battery when the input data is input to the input layer, the input data representing a prescribed closed circuit voltage (CCV) waveform of the secondary battery, the prescribed CCV waveform being any one of a CCV charging waveform and a CCV discharging waveform, the CCV charging waveform representing transition of a CCV during constant-current charging of the secondary battery, the CCV discharging waveform representing transition of a CCV during constant-current discharging of the secondary battery, and the estimation device estimating the full charge capacity of the target battery by inputting the input data obtained for the target battery into the input layer of the trained model.

2. The battery management system according to claim 1, further comprising:

a charging apparatus that obtains the prescribed CCV waveform that is the CCV charging waveform for the target battery by carrying out constant-current charging of the target battery; and a first generation device that generates the input data from the prescribed CCV waveform obtained by the charging apparatus, wherein the estimation device estimates the full charge capacity of the target battery by inputting the input data generated by the first generation device into the input layer of the trained model.

3. The battery management system according to claim 2, wherein
an SOC range of the prescribed CCV waveform used for generation of the input data by the first generation device is a prescribed SOC range selected from a range not lower than 0% and not higher than 10%.

4. The battery management system according to claim 1, further comprising:
a discharging apparatus that obtains the prescribed CCV waveform that is the CCV discharging waveform for the target battery by carrying out constant-current discharging of the target battery; and
a second generation device that generates the input data from the prescribed CCV waveform obtained by the discharging apparatus, wherein
the estimation device estimates the full charge capacity of the target battery by inputting the input data generated by the second generation device into the input layer of the trained model.

5. The battery management system according to claim 1, wherein
the at least one trained model includes a plurality of trained model, and
the estimation device
obtains information on the target battery,
selects one trained model corresponding to the target battery from among the plurality of trained model based on the obtained information, and
estimates the full charge capacity of the target battery by using the selected trained model.

6. The battery management system according to claim 1, further comprising a sorting device that determines an application of the target battery based on the full charge capacity estimated by the estimation device.

7. A battery management method comprising:
obtaining a prescribed closed circuit voltage (CCV) waveform of a target battery that is a prescribed secondary battery;
generating input data for a trained model from the prescribed CCV waveform; and
inputting the input data to the trained model; and
estimating, by the trained model, a full charge capacity of the target battery,
the input data representing the prescribed CCV waveform of the target battery,
the prescribed CCV waveform being any one of a CCV charging waveform and a CCV discharging waveform, the CCV charging waveform representing transition of a CCV during constant-current charging of the target battery, the CCV discharging waveform representing transition of a CCV during constant-current discharging of the target battery.

8. The battery management method according to claim 7, further comprising, before the obtaining a prescribed CCV waveform, performing a preparation process for each vehicle to store a plurality of secondary batteries in an empty state,
the preparation process comprising
collecting the secondary battery from a vehicle,
carrying out remaining capacity discharging of the collected secondary battery, and
storing the secondary battery in the empty state after the remaining capacity discharging, wherein
the obtaining a prescribed CCV waveform includes
selecting the target battery from among the plurality of secondary batteries stored in the empty state, and
obtaining the prescribed CCV waveform that is the CCV charging waveform for the target battery by carrying out constant-current charging of the target battery.

9. The battery management method according to claim 7, further comprising, after the estimating a full charge capacity:
sorting the target battery based on the full charge capacity estimated by the trained model; and
shipping the target battery in accordance with a result of the sorting.

10. A method of manufacturing a battery assembly, the method comprising:
obtaining a prescribed closed circuit voltage (CCV) waveform of a target battery that is a prescribed secondary battery;
generating input data for a trained model from the prescribed CCV waveform;
inputting the input data to the trained model;
estimating, by the trained model, a full charge capacity of the target battery; and
manufacturing a battery assembly from a plurality of secondary batteries of which full charge capacity has been estimated by the trained model,
the input data representing the prescribed CCV waveform of the target battery, and
the prescribed CCV waveform being any one of a CCV charging waveform and a CCV discharging waveform, the CCV charging waveform representing transition of a CCV during constant-current charging of the target battery, the CCV discharging waveform representing transition of a CCV during constant-current discharging of the target battery.

* * * * *